United States Patent
Asano et al.

(10) Patent No.: US 10,464,039 B2
(45) Date of Patent: Nov. 5, 2019

(54) MICROREACTOR, CHEMICAL PRODUCT MANUFACTURING SYSTEM AND MICROREACTOR MANUFACTURING METHOD

(71) Applicant: HITACHI, LTD., Tokyo (JP)

(72) Inventors: Yukako Asano, Tokyo (JP); Masashi Oda, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 16/092,567

(22) PCT Filed: Mar. 13, 2017

(86) PCT No.: PCT/JP2017/010021
§ 371 (c)(1),
(2) Date: Oct. 10, 2018

(87) PCT Pub. No.: WO2017/179353
PCT Pub. Date: Oct. 19, 2017

(65) Prior Publication Data
US 2019/0118156 A1    Apr. 25, 2019

(30) Foreign Application Priority Data
Apr. 12, 2016 (JP) .................. 2016-079269

(51) Int. Cl.
*B01J 19/00* (2006.01)
*B81B 1/00* (2006.01)
(Continued)

(52) U.S. Cl.
CPC ........... *B01J 19/0093* (2013.01); *B01J 19/00* (2013.01); *B81B 1/00* (2013.01); *B81B 7/02* (2013.01);
(Continued)

(58) Field of Classification Search
CPC .............. B01J 19/0093; B01J 19/00; B01J 2219/00959; B01J 2219/00808;
(Continued)

(56) References Cited

U.S. PATENT DOCUMENTS

| 5,783,129 A * | 7/1998 | Shirai | ............... B29B 15/122 |
| | | | 156/180 |
| 2003/0077204 A1* | 4/2003 | Seki | ................. B01F 5/0471 |
| | | | 422/70 |

(Continued)

FOREIGN PATENT DOCUMENTS

| JP | 2007-014936 A | 1/2007 |
| JP | 2007-111654 A | 5/2007 |

(Continued)

OTHER PUBLICATIONS

International Search Report of PCT/JP2017/010021 dated May 30, 2017.

*Primary Examiner* — Huy Tram Nguyen
(74) *Attorney, Agent, or Firm* — Mattingly & Malur, PC

(57) ABSTRACT

In mixing of raw materials having different flow rate ratios (volume ratios) (different flow rates), in order to achieve a good mixing effect, the present invention includes: for raw materials having different flow rates, a high-flow-rate side flow path (102) through which a raw material on a high-flow-rate side flows; a low-flow-rate side flow path (103) through which a raw material on a low-flow-rate side flows; branch flow paths (102a, 102b) which are branched from the high-flow-rate side flow path; and a residence flow path (104) which is a flow path after the branch flow paths (102a, 102b) and the low-flow-rate side flow path (103) merge. The branch flow path (102a) and the branch flow path (102b) merge in a way of sandwiching the low-flow-rate side flow path (103).

12 Claims, 17 Drawing Sheets

(51) Int. Cl.
*B81B 7/02* (2006.01)
*B81C 3/00* (2006.01)

(52) U.S. Cl.
CPC ......... *B81C 3/00* (2013.01); *B01J 2219/0086* (2013.01); *B01J 2219/00808* (2013.01); *B01J 2219/00833* (2013.01); *B01J 2219/00889* (2013.01); *B01J 2219/00894* (2013.01); *B01J 2219/00896* (2013.01); *B01J 2219/00959* (2013.01)

(58) Field of Classification Search
CPC ...... B01J 2219/00833; B01J 2219/0086; B01J 2219/00889; B01J 2219/00896; B01J 2219/00894; B81C 3/00; B81B 7/02; B81B 1/00
USPC .......................................... 422/198, 601, 603
See application file for complete search history.

(56) References Cited

U.S. PATENT DOCUMENTS

| | | | | |
|---|---|---|---|---|
| 2003/0159742 A1* | 8/2003 | Karp | ..................... | B01F 5/0471 137/833 |
| 2009/0178935 A1* | 7/2009 | Reymond | .......... | G01N 27/3273 205/777.5 |
| 2010/0027372 A1* | 2/2010 | Ozawa | .................. | B01F 3/0807 366/341 |
| 2011/0171082 A1* | 7/2011 | Shiraishi | ............... | B01F 5/0057 422/198 |
| 2016/0263546 A1 | 9/2016 | Yoon et al. | | |

FOREIGN PATENT DOCUMENTS

| | | | |
|---|---|---|---|
| JP | 2007-136322 | A | 6/2007 |
| JP | 2008-183554 | A | 8/2008 |
| JP | 2008-284626 | A | 11/2008 |
| JP | 2008-290038 | A | 12/2008 |
| JP | 4339163 | B2 | 10/2009 |
| JP | 2010-029790 | A | 2/2010 |
| JP | 2011-194379 | A | 10/2011 |
| JP | 2011-206651 | A | 10/2011 |
| JP | 5001529 | B2 | 8/2012 |
| JP | 5023902 | A | 9/2012 |
| JP | 2013-027798 | A | 2/2013 |
| WO | 2015/076546 | A1 | 5/2015 |

* cited by examiner

MICROREACTOR, CHEMICAL PRODUCT MANUFACTURING SYSTEM AND MICROREACTOR MANUFACTURING METHOD

TECHNICAL FIELD

The present invention relates to a microreactor which mixes raw materials, a chemical product manufacturing system and a microreactor manufacturing method.

BACKGROUND ART

In recent years, efforts have been actively made to apply a device which mixes fluids in a fine flow path prepared by a micro processing technique or the like, namely a microreactor, to biotechnology field, medical field, and chemical synthesis field of medicines, chemical products, or the like.

Synthesis reactions in a microreactor have the following features. That is, as the size of the reaction field in the microreactor decreases, fluids are mixed rapidly due to molecular diffusion. As a result, the effect of surface area on the volume of the fluid becomes relatively large, and the effect of heat transfer on the volume of the fluid becomes relatively large. Therefore, compared to general batch reactions, the production efficiency is expected to be improved by shortened reaction time and yield improvement.

Since the microreactor is a closed system which provides a small reaction field, the microreactor is suitable for handling highly corrosive substances and dangerous synthesis reactions. Even if the productivity of a single microreactor is small, the same product can be produced in large quantities by multiplying the number of the microreactors by N times, that is, so-called "numbering-up".

In addition, in the field of biotechnology or medicine synthesis, although the corrosiveness of the substance to be handled is relatively low, cross-contamination caused by inclusion of foreign matters from the outside is usually not preferred.

By using resins such as PDMS (polydimethylsiloxane), ABS resin, or PC (polycarbonate) as the material, the cost of material and molding process is reduced, so that the microreactor is for single use (disposable).

Various developments and studies have been carried out with respect to a flow path structure of a microreactor which is oriented for application to each of the fields mentioned above and in which two types of fluids are rapidly mixed.

As a first method, there has been known a technique in which two types of raw materials are each branched into a plurality of parts, and can be alternately introduced in a radial manner to form multilayer flows toward the center and merge with one another (refer to, for example, PTL 1 and PTL 2).

PTL 1 (refer to claim 1) describes a micro-device which "supplies two or more incoming fluids independently to a merging area and discharges the fluids from the merging area, comprising: supplying channels configured to supply each incoming fluid of the micro-device respectively to the merging area; and a discharging channel configured to discharge the merged fluids from the merging area to the outside of the micro-device, wherein the supplying channel, which supplies at least one fluid, has a plurality of sub-channels merging in the same merging area, the sub-channels and the supplying channels are configured such that a central axis of at least one of the plurality of sub-channels and a central axis of at least one of the supplying channels or the sub-channels supplying at least one of the fluids other than the fluid supplied by the above sub-channel intersect with each other at a point" and a method for merging of fluids.

In addition, PTL 2 (refer to claim 1) describes a method for producing organic pigment fine particles, comprising "allowing two or more solutions, at least one of which is an organic pigment solution in which an organic pigment is dissolved and at least one of which is a pH adjustor, to flow through a micro flow path in a non-laminar state; and depositing organic pigment fine particles from the organic pigment solution in a process of flowing, wherein the organic pigment solution is a solution in which an organic pigment is dissolved in an alkaline or acidic aqueous medium, the organic pigment fine particles are deposited by changing a hydrogen ion exponent (pH) of the organic pigment solution in the process of flowing in the micro flow path, and intersection angles $\alpha$ and $\beta$ upon merging of solutions of the organic pigment solution and the pH adjustor are set to satisfy a relationship of S1>S2 if a sum of the cross-sectional areas of all of the merged solutions in the thickness direction is defined as S1 and the cross-sectional area of the micro flow path in the radial direction is defined as S2".

In addition, as a second method, there has been known a technique in which two types of raw materials are each branched into a plurality of parts, and one type of the branched raw materials merges in a way of being sandwiched by the other type of branched raw materials, so as to finally perform the merging (for example, refer to PTL 3).

PTL 3 describes an emulsifying device "comprising an introducing member; a first member connected with the introducing member; a second member connected with the first member; a third member connected with the second member; and a discharge member connected with the third member, in a laminated manner. In each of a dispersion phase inflow path through which a first liquid flows and which penetrates the introducing member and the first member in a lamination direction; a continuous phase inflow path through which a second liquid which is dissoluble in the first liquid flows, and which is provided between the first member and the second member; a mixing flow path which penetrates the second member in the lamination direction and configured to form a sheath flow in which the first liquid flowing from the dispersion phase inflow path flows on an inner side, the second liquid flowing from the continuous phase inflow path flows on an outer side to form a mixed liquid; and an enlarged mixing flow path which penetrates the third member and the discharge member in the lamination direction and has a larger flow path width than the mixing flow path, the dispersion phase inflow path, the mixing flow path, and the enlarged mixing flow path are provided coaxially, the mixing flow path and the enlarged mixing flow path are formed on separate members respectively, the first liquid contained in the mixed liquid is divided while flowing in the mixing flow path and the enlarged mixing flow path so as to form emulsion particles, and thus emulsification is performed".

PRIOR ART LITERATURE

Patent Literature

PTL 1: U.S. Pat. No. 4,339,163 specification
PTL 2: U.S. Pat. No. 5,001,529 specification
PTL 3: U.S. Pat. No. 5,023,902 specification

SUMMARY OF INVENTION

Technical Problem

Here, in the technique of the flow path structure described in PTL 1, two types of raw materials are each branched into a plurality of parts, and can be alternately introduced in a radial manner to form multilayer flows toward the center and merge with one another. In this technique, since the flow rate ratio (volume ratio) of the two types of raw materials does not change even when the raw materials are branched, a sufficient interfacial area between the raw materials may not be obtained if the flow rate ratio (volume ratio) is greatly biased. Here, the flow rate refers to the volume of a flowing fluid per unit time.

In addition, in the technique of the flow path structure described in PTL 2, two types of raw materials are each branched into a plurality of parts, and one type of the branched raw materials merges in a state of being sandwiched by the other type of branched raw materials so as to finally perform the merging. In this technique, fine flow paths are required according to the number of the branches. However, since materials having high corrosion resistance are difficult to be finely processed, the technique may be difficult to be applied to highly corrosive substances or dangerous synthesis reactions.

Further, in the technique of the flow path structure described in PTL 3, the flow path internal volume (internal capacity) of each raw material, from the introduction of the two types of raw materials to the merging thereof, are substantially the same. In this way, when the flow rate ratio (volume ratio) of the two types of raw materials is largely biased, more raw materials will flow on a high-flow-rate side. For this reason, the raw materials on the high-flow-rate side may flow into the flow path for raw materials on a low-flow-rate side at the beginning of the manufacture of chemical products.

The invention has been made in view of the above background. An object of the invention is to obtain good mixing effect when mixing raw materials having different flow rates.

Solution to Problems

To solve the problems, the invention is provided with a plurality of flow paths for a plurality of raw materials with different flow rates to flow therethrough respectively. The flow paths are branched and merged such that a flow path for a high-flow-rate raw material branches into a plurality of paths and then merges to a flow path for a low-flow-rate raw material.

Other solutions will be described in embodiments.

Advantageous Effect

According to the invention, a good mixing effect can be obtained when mixing raw materials having different flow rates.

DESCRIPTION OF EMBODIMENTS

Next, embodiments for implementing the invention (referred to as "embodiments") will be appropriately described in detail with reference to the drawings.

First Embodiment

Figure 1:
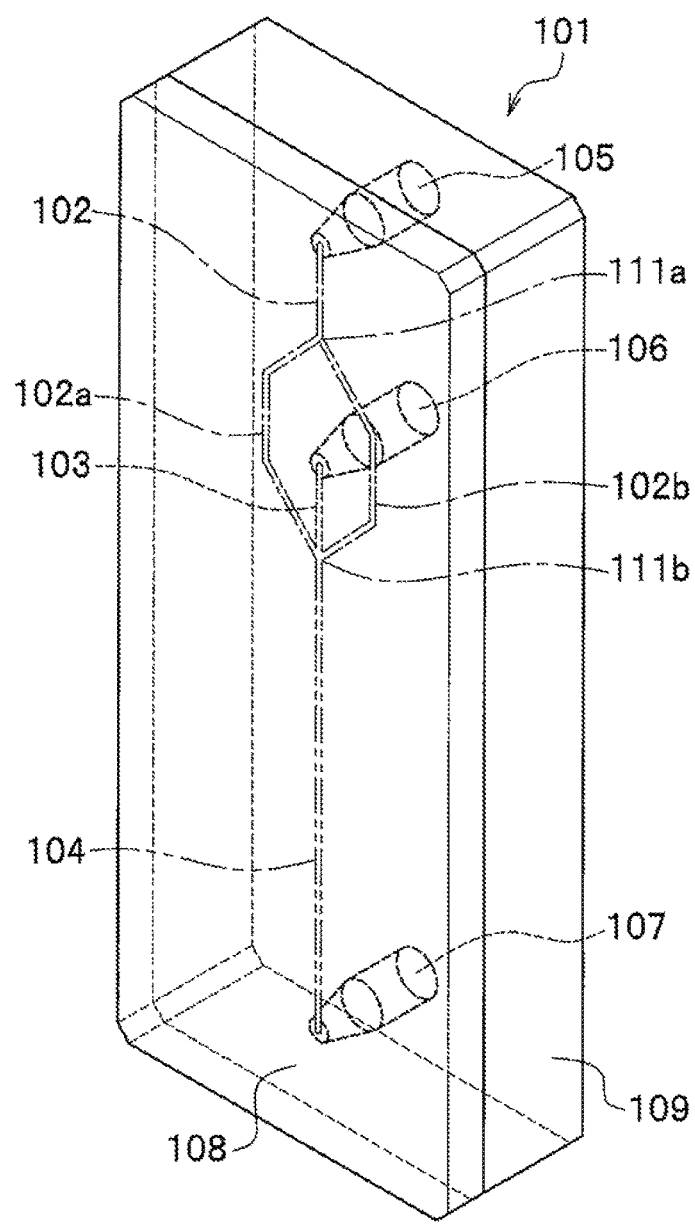
FIG. 1 is an external view of a microreactor according to a first embodiment.

Hereinafter, a first embodiment will be described with reference to FIGS. 1 to 5.
FIG. 1 is an external view of a microreactor according to the first embodiment.
A microreactor 101 of FIG. 1 includes a high-flow-rate side flow path 102, a low-flow-rate side flow path 103, a residence flow path 104, a high-flow-rate side introduction port 105, a low-flow-rate side introduction port 106, and a discharge port 107.
As shown in FIG. 1, a raw material on the high-flow-rate side (a high-flow-rate raw material) is introduced from the high-flow-rate side introduction port 105, and flows through the high-flow-rate side flow path 102 (the flow path for a high-flow-rate raw material) indicated by a one-dot chain line. In addition, a raw material on the low-flow-rate side (a low-flow-rate raw material) is introduced from the low-flow-rate side introduction port 106, and flows through the low-flow-rate side flow path 103 (the flow path for a low-flow-rate raw material) indicated by a broken line. Here, at a branch point 111a, as the high-flow-rate side flow path 102 is branched into two paths: a branch flow path 102a and a branch flow path 102b indicated by one-dot chain lines, the raw material on the high-flow-rate side is also branched into two parts. At a merging point 111b, the raw material on the high-flow-rate side merges in a way of sandwiching the raw material on the low-flow-rate side. Here, the high-flow-rate raw material is mixed with the raw material on the low-flow-rate side. Hereinafter, the product obtained by mixing the raw material on the high-flow-rate side and the raw material on the low-flow-rate side is referred to as a mixture. The mixture finally flows through the residence flow path 104 indicated by a two-dot chain line and is discharged from the discharge port 107. Here, the residence flow path 104 serves as a reaction field in a case where the flow rate of the mixture is small. However, in a case where the flow rate of the mixture is large, the mixture does not react in the residence flow path 104, and is discharged from the discharge port 107 in the form of mixture. In this case, the residence flow path 104 serves as a mixing field.

The high-flow-rate side path 102 is branched into two branches, the branch flow path 102a and the branch flow path 102b, and thus the flow path internal volume (internal capacity) of the high-flow-rate side flow path 102 is larger than the flow path internal volume of the low-flow-rate side flow path 103.

Here, it is desirable that the ratio between the flow path internal volume of the high-flow-rate side flow path 102 and the flow path internal volume of the low-flow-rate side flow path 103 is approximate to the flow rate ratio (volume ratio) between the two types of raw materials, but the invention is not limited thereto. The flow path internal volume of the high-flow-rate side flow path 102 and the flow path internal volume of the low-flow-rate side path 103 may be set such that the pressure losses during the flowing of the two types of raw materials are equal or approximate to each other.

Here, it is desirable that the cross-sectional areas of the high-flow-rate side flow path 102, the branch flow paths 102a, 102b, the low-flow-rate side flow path 103 and the residence flow path 104 are the same from the viewpoint of the manufacturing method of the microreactor 101 to be described later in FIG. 5 (the cross-sectional area of the high-flow-rate side flow path 102≈ the total cross-sectional area of the branch flow paths 102a, 102b≈ the cross-sectional areas of the low-flow-rate side flow path 103≈ the cross-sectional area of the residence flow path 104). In this way, the cross-sectional area of the raw material on the high-flow-rate side in the residence flow path 104 is smaller than the total cross-sectional areas of the branch flow paths 102a and 102b. The cross-sectional area of the raw material on the low-flow-rate side in the residence flow path 104 is smaller than the cross-sectional area of the low-flow-rate side flow path 103. For this reason, the raw material on the high-flow-rate side flowing from the high-flow-rate side flow path 102 and the raw material on the low-flow-rate side flowing from the low-flow-rate side flow path 103 are mixed satisfactorily. A pump 204 (refer to FIG. 3) is connected to the high-flow-rate side introduction port 105 and the low-flow-rate side introduction port 106. Since the raw materials on the high-flow-rate side and the low-flow-rate side are driven by a discharge force of the pump 204 to flow, the respective raw materials can flow into the residence flow path 104 even if the cross-sectional areas of the branch flow paths 102a, 102b and the low-flow-rate side flow path 103 are the same.

In the microreactor 101 shown in FIG. 1, the lengths of the high-flow-rate side flow path 102 and the branch flow paths 102a, 102b are configured to be longer than the low-flow-rate side flow path 102, so that the flow path internal volume of the high-flow-rate side flow path 102 is larger than the flow path internal volume of the low-flow-rate side flow path 103, but the invention is not limited thereto. For example, the flow path internal volume of the high-flow-rate side flow path 102 may be larger than the flow path internal volume of the low-flow-rate side flow path 103 by making the cross-sectional area of the high-flow-rate side flow path 102 larger than the low-flow-rate side flow path 103. The flow path internal volume of the high-flow-rate side flow path 102 may be larger than the flow path internal volume of the low-flow-rate side flow path 103 by both setting the lengths and cross-sectional areas of the high-flow-rate side flow path 102 and the branch flow paths 102a and 102b.

Further, it is desirable that the pressure loss in the flow path of the high-flow-rate side flow path 102 is substantially equal to the pressure loss in the low-flow-rate side flow path 103.

Screw holes for fitting connection are formed in the high-flow-rate side introduction port 105, the low-flow-rate side introduction port 106, and the discharge port 107 (not shown). By using the fitting (not shown), tubes 213 (refer to FIG. 3) can be connected to the high-flow-rate side introduction port 105, the low-flow-rate side introduction port 106, and the discharge port 107.

The microreactor 101 is configured by two plates: an upper plate 108 and a lower plate 109. The high-flow-rate side flow path 102, the branch flow paths 102a, 102b, the low-flow-rate side flow path 103, and the residence flow path 104 are formed on the upper plate 108. The high-flow-rate side introduction port 105, the low-flow-rate side introduction port 106, and the discharge port 107 are formed on the lower plate 109. The upper plate 108 and the lower plate 109 are integrated by welding. The welding method will be described later.

In order to obtain good mixing, it is desirable that representative diameters of the high-flow-rate side flow path 102, the low-flow-rate side flow path 103 and the residence flow path 104 in the microreactor 101 are set to be 2 mm or less. In particular, in order to rapidly mix the two types of raw materials by molecular diffusion at the merging point 111b and in the residence flow path 104, it is desirable that the representative diameters of the flow paths are set within a range from tens of μm to 1 mm. In addition, in the microreactor 101, the two types of raw materials may be mixed uniformly, or may be non-uniform (in a so-called emulsified state) without being mixed.

Further, since the raw material on the high-flow-rate side are branched into two parts, the raw material on the high-flow-rate side is merged with the raw material on the low-flow-rate side from other directions at the merging point 111b, so that a good mixing can be realized. As a result, as shown in FIG. 2, an interfacial area 112 of the two types of raw materials (the raw material 603 on the high-flow-rate side and the raw material 602 on the low-flow-rate side) is twice the interfacial area determined by the flow rate ratio (volume ratio), so that the mixing efficiency can be improved even if the structure is not such fine.

In the techniques disclosed in PTL 1 to PTL 3, the cases where the raw materials have different flow rate ratios (flow rates) are not considered.

Figure 2:
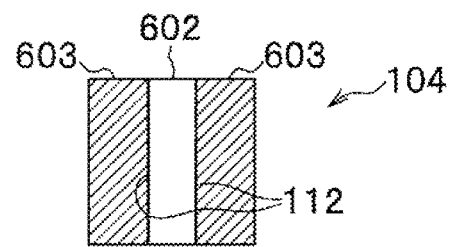
FIG. 2 is a view showing a state of mixing in a residence flow path.

In particular, as in the microreactor 101 shown in FIG. 1, at the merging point 111b, the branch flow path 102a and the branch flow path 102b merge with the low-flow-rate side flow path 103 at the same time, so that the raw material 603 on the high-flow-rate side merges in a way of sandwiching the raw material 602 on the low-flow-rate side, as shown in FIG. 2. As a result, the interfacial area 112 of the two types of raw materials is twice the interfacial area determined by the flow rate ratio (volume ratio), so that the mixing efficiency can be improved even if the structure is not such fine.

In FIG. 2, in order to make the merging state easily understood, an image in which the raw material 603 on the high-flow-rate side is not mixed with the raw material 602 on the low-flow-rate side is described in FIG. 2. Actually, the raw material 603 on the high-flow-rate side and the raw material 602 on the low-flow-rate side are in a mixed state.

In addition, in the microreactor 101 according to the present embodiment, the raw material on the high-flow-rate side is branched into two parts, so that the flow path internal volume of the high-flow-rate side flow path 102 is larger than the flow path internal volume of the low-flow-rate side flow path 103. For this reason, the raw material on the high-flow-rate side can be prevented from flowing into the low-flow-rate side flow path 103 at the beginning of chemical product manufacture.

That is, if the flow path internal volume of the high-flow-rate side flow path 102 and the flow path internal volume of the low-flow-rate side flow path 103 are the same, the raw material on the high-flow-rate side reaches the merging point 111b earlier, because the flow velocity of the raw material on the high-flow-rate side is faster. Then, the raw material on the high-flow-rate side, which has reached the merging point 111b earlier, flows into the low-flow-side flow path 103, that is, reverse flowing.

In the present embodiment, the flow path internal volume of the high-flow-rate side flow path 102 is made larger than the flow path internal volume of the low-flow-rate side flow path 103, thereby increasing the time for the raw material on the high-flow-rate side to reach the merging point 111b. Accordingly, the raw material on the high-flow rate side and the raw material on the low-flow-rate side can reach the merging point 111b at substantially the same time. One point of the present embodiment is that the flow path internal volume of the flow paths (the high-flow-rate side flow path 102 and the branch flow paths 102a, 102b) in which the raw material on the high-flow-rate side flows is made larger than the flow path internal volume of the flow path (the low-flow-rate side flow path 103) in which the raw material on the low-flow-rate side flows.

Figure 3:
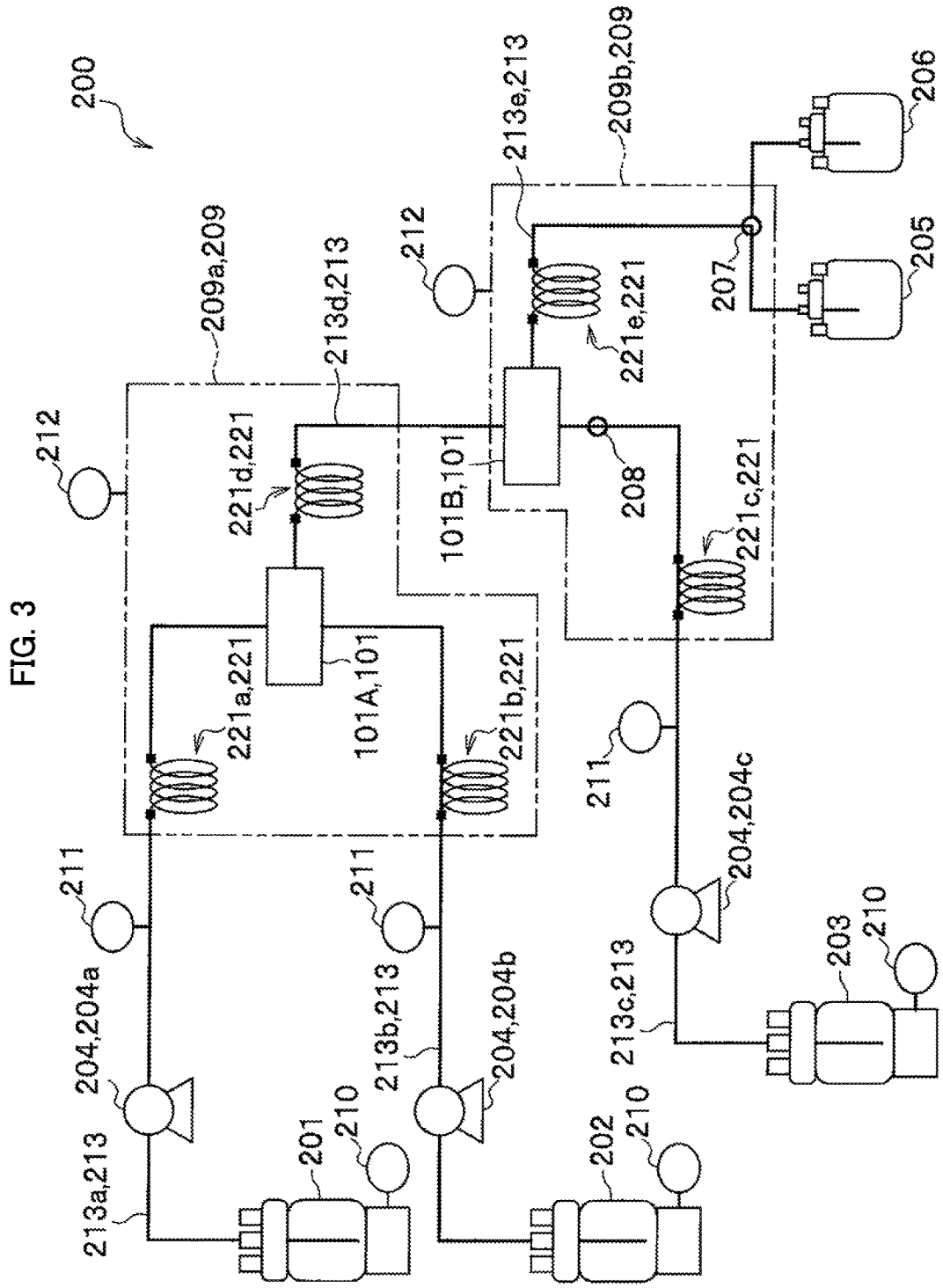
FIG. 3 is a schematic view of a chemical product manufacturing system according to the first embodiment.

FIG. 3 is a schematic view of a chemical product manufacturing system according to the first embodiment.

A chemical product manufacturing system 200 of FIG. 3 includes a high-flow-rate side raw material container 201, a first low-flow-rate side raw material container 202, a second low-flow-rate side raw material container 203, pumps 204 (204a to 204c), a product container 205, and a waste container 206. Further, the chemical product manufacturing system 200 includes a switching valve 207, a check valve 208, thermostatic tanks 209 (209a and 209b), weight sensors 210, pressure sensors 211, temperature sensors 212, tubes 213 (213a to 213e), and microreactors 101 (101A and 101B). Here, the microreactor 101A and the microreactor 101B have the same structure as the microreactor 101 shown in FIG. 1.

A computer (not shown) is connected to the chemical product manufacturing system 200. The computer obtains information from each weight sensor 210, each pressure sensor 211, each temperature sensor 212, or the like. The computer controls each pump 204 (204a to 204c), the switching valve 207, and heaters in the thermostatic tanks 209 based on the obtained information.

Here, the thermostatic tanks 209 keep each raw material and the mixture obtained by the microreactor 101 at an optimum temperature for the reaction, and hold the microreactor 101. The tubes 213 include loops 221 (221a to 221e). The thermostatic tanks 209 and the loops 221 will be described later.

As shown in FIG. 3, a raw material on the high-flow-rate side and a raw material on the first low-flow-rate side are introduced from the high-flow-rate side raw material container 201 and the first low-flow-rate side raw material container 202 into the first microreactor 101A through the respective tubes 213a and 213b by the respective pumps 204 (204a and 204b). A first mixture is obtained by mixing the raw material on the high-flow-rate side and the raw material on the first low-flow-rate side in the first microreactor 101A.

Meanwhile, a raw material on the second low-flow-rate side is introduced from the second low-flow-rate side raw material container 203 to the second microreactor 101B through the tube 213c by the pump 204c. The first mixture obtained in the first microreactor 101A is introduced into the second microreactor 101B through the tube 213d. The first mixture and the raw material on the second low-flow-rate side are mixed in the second microreactor 101B. An obtained second mixture is collected by the product container 205 or the waste container 206 via the switching valve 207 through the tube 213e.

At the beginning of the chemical product manufacture, firstly, the raw material on the high-flow-rate side and the raw material on the first low-flow-rate side are introduced nearly into the first microreactor 101A, respectively. Then, the raw material on the second low-flow-rate side is introduced nearly into the second microreactor 101B. Then, introduction of the raw material on the high-flow-rate side and the raw material on the first low-flow-rate side into the microreactor 101A begins.

When the first mixture obtained in the first microreactor 101A is introduced nearly into the second microreactor 101B, introduction of the raw material on the second low-flow-rate side to the microreactor 101B begins.

By stopping the pump 204, the raw materials and the mixture are stopped before reaching the microreactor 101A or 101B.

In this way, the time for the introduction of each raw material into the microreactors 101A, 101B can be shortened, and the time spent from the beginning of the introduction of the raw materials to the obtaining of the product can be shortened. In addition, the waste of each raw material can be prevented, and the use of expensive raw materials can be minimized in this way.

Further, in the chemical product manufacturing system 200 shown in FIG. 3, the check valve 208 is provided just before the introduction of the raw material side on the second low-flow-rate side into the second microreactor 101B. In this way, when only the raw materials on the high-flow-rate side and the raw material on the first low-flow-rate side are introduced, air inside the first microreactor 101A or the tube 213d can be prevented from flowing into the raw material side of second low-flow-rate side via the introduction flow path (the low-flow-rate side flow path 103 in the microreactor 101B (FIG. 1)) for the raw material on the second low-flow-rate side in the second microreactor 101B.

The check valve 208 may also be provided just before the introduction of the raw material on the high-flow-rate side and the raw material on the first low-flow-rate side into the first microreactor 101A. In this way, when the raw material on the high-flow-rate side is not introduced, the raw material on the first low-flow-rate side can be prevented from flowing into the introduction flow path (the high-flow-rate side flow path 102 and the branch flow paths 102a, 102b in the microreactor 101A (FIG. 1)) on the raw material side of the high-flow-rate side by capillary phenomenon or the like. When the raw material on the first low-flow-rate side is not introduced, the raw material on the high-flow-rate side can be prevented from flowing into the introduction flow path (the low-flow-rate side flow path 103 in the microreactor 101A (FIG. 1)) on the raw material side of the first low-flow-rate side.

In the chemical product manufacturing system 200 shown in FIG. 3, weights of the high-flow-rate side raw material container 201, the first low-flow-rate side raw material container 202 and the second low-flow-rate side raw material container 203 are measured by each of the weight sensors 210. Further, the computer (not shown) grasps the amounts of each of the raw material on the high-flow-rate side, the raw material on the first low-flow-rate side, and the raw material on the second low-flow-rate side introduced by the pumps 204 (204a to 204c). The computer may obtain time series of the weight data from the weight sensors 210 and combine the time series with time data (not shown) to calculate respective flow rate data of the raw material on the high-flow-rate side, the raw material on the first low-flow-rate side, and the raw material on the second low-flow-rate side. When the raw material on the high-flow-rate side, the raw material on the first low-flow-rate side, and raw material on the second low-flow-rate side are materials that can be cleaned after wetting from the viewpoint of chemical hazard, flow rate sensors (not shown) can be provided instead of the weight sensors 210 to measure the flow rate. Based on densities of the raw material on the high-flow-rate side, the raw material on the first low-flow-rate side and the raw material on the second low-flow-rate side, the time-series data of flow rate, and time data, the computer may calculate changes in weight to replace the weight sensors 210.

In the chemical product manufacturing system 200 shown in FIG. 3, the pressures (discharge pressures) of the raw material on the high-flow-rate side, the raw material on the first low-flow-rate side and the raw material on the second low-flow-rate side in the tubes 213 inside the chemical product manufacturing system 200 are measured by each of the pressure sensors 211. Accordingly, precipitation of substances contained in the raw material, clogging caused by an unexpected increase in viscosity, or the like in the high-flow-rate side flow path 102, the low-flow-rate side flow path 103, the residence flow path 104 (FIG. 1), and the tubes 213 in the microreactor 101 can be detected. The maximum pressure allowed by the chemical product manufacturing system 200 is determined in advance, and the computer may obtain time-series data of the pressure data from the pressure sensors 211 and stop the operation of the pumps 204 when the maximum pressure is reached. A relief valves or the like which detects a value of a certain pressure and release the pressure can be used as the pressure sensor 211.

Further, in the chemical product manufacturing system 200 shown in FIG. 3, the temperatures of the two microreactors 101A, 101B are adjusted by the thermostatic tanks 209a, 209b, respectively, and the temperatures are measured by each of the temperature sensors 212. Accordingly, the raw materials introduced into each of the microreactors 101A, 101B can be mixed at a predetermined temperature. For example, the computer obtains time-series data of temperature data from the temperature sensors 212, and switches on and off a heater (not shown) or a cooler (not shown) to perform temperature adjustment in the thermostatic tanks 209 so as to satisfy the set temperature.

At this time, the thermostatic tanks 209 may perform temperature adjustment for a necessary time period in the loops 221a, 221b and 221c in the tubes 213 on the upstream side of the microreactor 101 according to the flow rates and the thermal conductivities of the raw material on the high-flow-rate side, the raw material on the first low-flow-rate side and the raw material on the second low-flow-rate side, and the wall thicknesses or the thermal conductivities of the tubes 213. In this way, the raw materials introduced into the microreactor 101 can be mixed at a more accurate predetermined temperature. When the raw materials introduced into the microreactor 101 are mixed to react with each other, the reaction is performed on the downstream side of the microreactor 101 if a residence time in the residence flow path 104 (refer to FIG. 1) is shorter than the reaction time. In this case, the lengths of the tubes 213d, 213e may be adjusted so as to ensure an appropriate residence time. Then, the reaction can be performed at a more accurate predetermined temperature by performing temperature adjustment by the thermostatic tanks 209a, 209b for necessary time periods in the loops 221d, 221e in the tubes 213d, 213e on the downstream side of the microreactor 101 according to the flow rate, thermal conductivity, and reaction heat of the mixed liquid and the wall thicknesses and thermal conductivities of the tubes 213.

In order to perform the mixing satisfactorily, it is desirable that the representative diameters of not only the flow paths in the microreactor 101 but also the flow paths of the tubes 213 (213d and 213e) on the downstream side of the microreactor 101 are set to be 2 mm or less.

In the chemical product manufacturing system 200 of FIG. 3, the raw material on the high-flow-rate side, the raw material on the first low-flow-rate side and the raw material on the second low-flow-rate side are respectively introduced by the pumps 204. Here, for example, tube pumps, syringe pumps, manual syringes, plunger pumps, diaphragm pumps, screw pumps, or the like can be used as the pumps 204. Liquid sending units taking advantages of water head difference may be used to replace the pumps 204.

Fluids such as water, water-ethanol mixed solvent and ethylene glycol, or a Peltier, a mantle heater or the like can be used as the temperature adjustment means of the thermostatic tanks 209. If the reaction temperature is the room temperature, the thermostatic tanks 209 are not necessarily required depending on reaction heat and the heat controllability of the microreactor 101.

Materials of liquid contacting portions in the microreactor 101, the high-flow-rate side raw material container 201, the first low-flow-rate side raw material container 202, and the second low-flow-rate side raw material container 203 may be any materials which have no negative influence on the mixing and subsequent reactions. The material of the liquid contacting portions can be appropriately changed according to the types of the raw material on the high-flow-rate side, the raw material on the first low-flow-rate side, and the raw material on the second low-flow-rate side.

Similarly, the materials of the liquid contacting portions of the pumps 204, the tubes 213, and fittings (not shown) connecting the microreactor 101 and the tubes 213, or the like may be any materials which have no negative influence on the mixing and subsequent reactions. The material of the liquid contacting portions can be appropriately changed according to the types of the raw material on the high-flow-rate side, the raw material on the first low-flow-rate side, and the raw material on the second low-flow-rate side. For example, stainless steel, silicon, gold, glass, Hastelloy, silicone resin, PP (polypropylene), TPX (polymethylpentene), PE (polyethylene), fluorine-based resin, or the like, which has high chemical resistance, can be used. Further, a glass lining, a material obtained by coating a surface of a metal with nickel or gold, a material obtained by oxidizing a surface of silicon, or the like, which has improved corrosion resistance, may be used.

Further, when tube pumps or syringe pumps are used as the pumps 204, various resins such as silicone resin, PP (polypropylene), and fluorine-based resin can be used as the materials of the tubes 213 or syringes which serve as the liquid contacting portions in the pumps 204. Further, various resins may be used for the high-flow-rate side raw material container 201, the first low-flow-rate side raw material container 202, the second low-flow-rate side raw material container 203, the tubes 213, and the fittings connecting the microreactor 101 and the tubes 213 (not shown). In this way, it is possible to use only the liquid contacting portions of the chemical product manufacturing system 200 as single use (disposable). The materials of the liquid contacting portions are not necessarily the same, and can be appropriately changed according to the processability of the microreactor 101 and the flexibility of the tube 213.

In the chemical product manufacturing system 200 of FIG. 3, two microreactors 101 are mounted for mixing the three types of raw materials including the raw material on the high-flow-rate side, the raw material on the first low-flow-rate side, and the raw material on the second low-flow-rate side in two stages. However, when the raw materials having two types of flow ratios are mixed, the mixing may be performed in one stage. In this case, the configuration related to the raw material on the second low-flow-rate side may be omitted from the chemical product manufacturing system 200.

Further, although three types of raw materials are mixed in two stages, raw materials on the low-flow-rate sides are of one type, there may be only one microreactor 101 of the present embodiment. For example, there is a difference between the flow rate ratios of two types among the three types, but the flow rate of the mixture of the raw materials having different flow rate ratios may be substantially the same as the flow rate of the remaining one type of raw material. In such a case, the microreactor configured to mix different flow rate ratios of the two microreactors 101 can be the microreactor 101 according to the present embodiment, and the microreactor in which the mixture and the remaining one type of raw material are mixed can be a general microreactor (not the microreactors of the present embodiment). At this time, the shape of flow path in the general microreactor may be a shape which form a multilayer flow, such as a Y-shape or a T-shape as long as the two types of raw materials are rapidly mixed.

Here, it is assumed that the raw materials having different flow rate ratios are firstly mixed, and then the raw material having substantially the same flow rate as the flow rate of the mixture are mixed, but the sequence may be reversed. That is, after the raw materials having substantially the same flow rates are mixed, the raw material having different flow rates from the mixture may be mixed. In this case, a general microreactor (not the microreactor of the present embodiment) is arranged in a former section, and the microreactor 101 according to the present embodiment is arranged at a subsequent section.

In a case where a plurality of (n) types (n is 3 or more) of raw materials are on the low-flow-rate side, with respect to the raw material on the high-flow-rate side, and n+1 types of raw materials are mixed in n stages, the chemical product manufacturing system 200 in FIG. 3 may be expanded and configured such that n microreactors 101 according to the present embodiment are mounted. In a case where n+1 types of raw materials are mixed in n stages, but m types (m is 2 or less) of raw materials are on the low-flow-rate side and m microreactors 101 of the present embodiment may be mounted, the remaining n-m microreactors are general microreactors (not the microreactor in the present embodiment) the shape of which may be a shape which form a multilayer flow, such as a Y shape or a T shape as long as the two types of materials are rapidly mixed. Further, a microreactor having flow paths for mixing three or more types of raw materials may be used as the general microreactor other than the microreactor 101. The raw materials may be mixed uniformly, or may be non-uniform (in a so-called emulsified state) without being mixed.

By using the chemical product manufacturing system 200 shown in FIG. 3, a chemical product manufacturing system 200 having the effect of the microreactor 101 can be realized. Further, by connecting a plurality of microreactors 101, two or more types of raw materials which can be mixed in one microreactor 101 can be mixed and react with each other.

Figure 4:
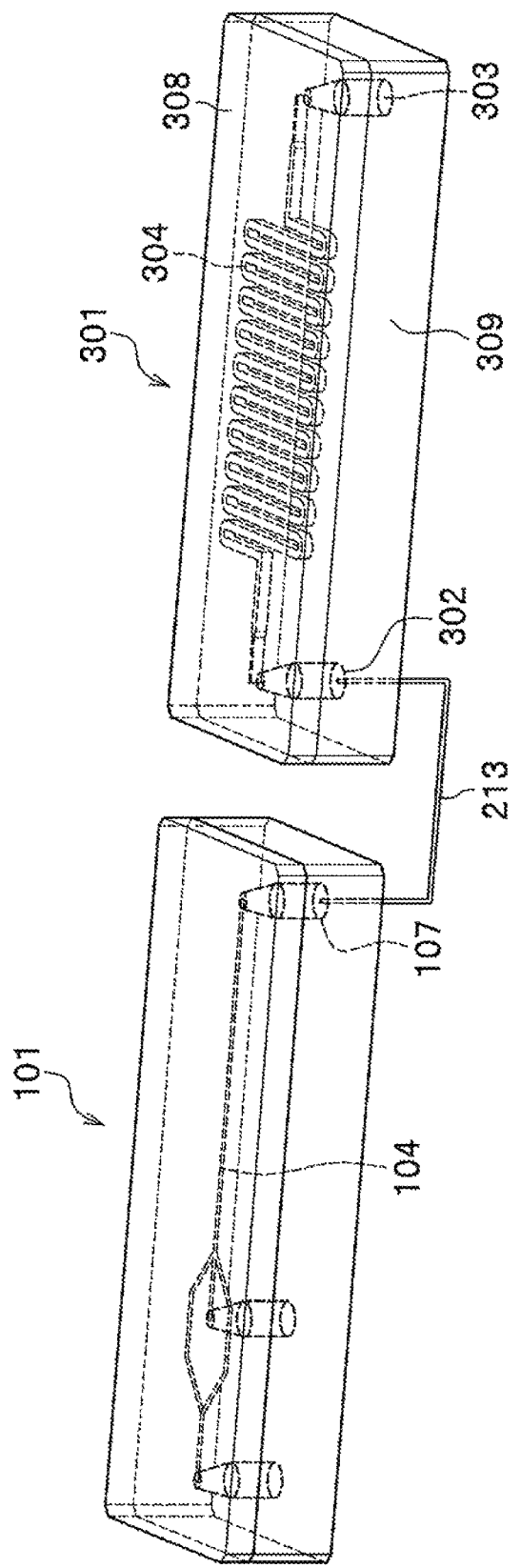
FIG. 4 is an external view showing a microreactor to which an adjustment microreactor is connected.

FIG. 4 is an external view showing a microreactor to which an adjustment microreactor is connected.

As described above, when the raw materials introduced into the microreactor 101 are mixed to react with each other, the reaction is performed on the downstream side of the microreactor 101 (after leaving the microreactor 101) if the residence time in the residence flow path 104 is shorter than the reaction time. When the reaction time is long, it is necessary to lengthen the residence flow path 104 so as to ensure a sufficient residence time in the flow paths of the microreactor 101. For this reason, the microreactor 101 becomes huge. In order to ensure the reaction time, an adjustment microreactor 301 as shown in FIG. 4 is prepared.

The adjustment microreactor 301 of FIG. 4 is configured by a residence flow path 304, a mixture introduction port 302, and a reactant discharge port 303. The discharge port 107 of the microreactor 101 and the mixture introduction port 302 of the adjustment microreactor 301 are connected with each other by a tube 213.

As shown in FIG. 4, a mixture obtained in the microreactor 101 passes through the discharge port 107 and the tube 213. Then the mixture is introduced into the residence flow path 304 of the adjustment microreactor 301 through the mixture introduction port 302. In addition to the residence flow path 104 of the microreactor 101, reactions of the mixture are also performed in the residence flow path 304 of the adjustment microreactor 301. As a result, the obtained reactant is discharged from the reactant discharge port 303.

Here, the reaction time of the mixture can be adjusted by operating the pumps 204 (see FIG. 3) continuously and setting the time during which the mixture flows in the residence flow paths 104 and 304 as the reaction time. Meanwhile, the pumps 204 may be temporarily stopped after the mixture filled the residence flow paths 104, 304 and the tubes 213. Then, after a predetermined time when the pumps 204 are stopped, the pumps 204 may be operated again and the mixture may be recovered from the reactant discharge port 303. A time obtained by adding the time during which the pumps 204 are stopped and the time during which the mixture flows in the residence flow paths 104, 304 and the tubes 213 can also be set as the reaction time of the mixture.

The adjustment microreactor 301 is configured by two plates: an upper plate 308 and a lower plate 309. The residence flow path 304 is formed on the upper plate 308. The mixture introduction port 302 and the reactant discharge port 303 are formed on the lower plate 309. The upper plate 308 and the lower plate 309 are integrated by welding by a method described later with reference to FIG. 5. In this way, since the adjustment microreactor 301 is integrated, leakage from the residence flow path 304 and contamination from the outside can be prevented, so that compounds having high safety and high stability can be manufactured even in a case where highly corrosive substances and synthesis reactions requiring attention in handling are handled or in a case where cross-contamination may occur.

The residence flow path 304 may also be formed on the lower plate 309.

In order to perform the reaction satisfactorily, it is desirable that the representative diameter of the flow path of the residence flow path 304 in the adjustment microreactor 301 is set to be 2 mm or less. In addition, in the adjustment microreactor 301, the mixture flowing in the residence flow path 304 may be mixed uniformly, or may be non-uniform (in a so-called emulsified state) without being mixed.

A material of the adjustment microreactor 301, similar to the microreactor 101, can be appropriately changed according to the type of the mixture as long as the material has no negative influence on the mixing and subsequent reactions. For example, stainless steel, silicon, gold, glass, Hastelloy, silicone resin, PP (polypropylene), TPX (polymethylpentene), PE (polyethylene), fluorine-based resin, or the like can be used. Further, a glass lining, a material obtained by coating a surface of a metal with nickel or gold, a material obtained by oxidizing a surface of silicon, or the like, which has improved corrosion resistance, may be used as the material of the adjustment microreactor 301.

A flow path internal volume of the residence flow path 304 in the adjustment microreactor 301 is set to be larger than the flow path internal volume of the residence flow path 104, so that the residence time of the mixture is increased.

Figure 5:
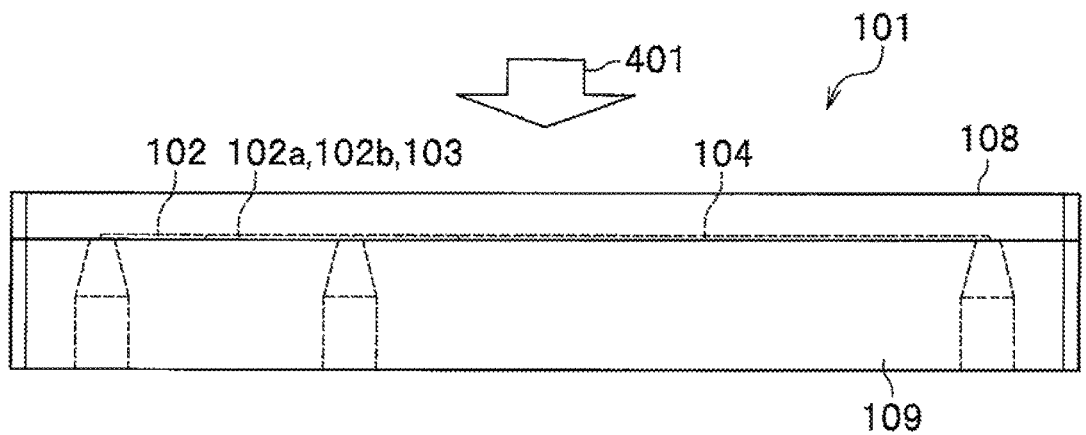
FIG. 5 is a side view for showing a microreactor manufacturing method according to the first embodiment.

FIG. 5 is a side view for showing the microreactor manufacturing method according to the first embodiment.

A material of the microreactor 101 in FIG. 5 is polymethylpentene or polyethylene.

As described above, the microreactor 101 is configured by two plates: the upper plate 108 and the lower plate 109. Each of the flow paths (the high-flow-rate side flow path 102, the branch flow paths 102a, 102b, the low-flow-rate side flow path 103, and the residence flow path 104) is formed on the upper plate 108, or may be formed on the lower plate 109. It is desirable that the upper plate 108 is made of white TPX (polymethylpentene) or PE (polyethylene). It is desirable that the lower plate 109 is made of colored (for example black) TPX (polymethylpentene) or PE (polyethylene). In this way, the upper plate 108 and the lower plate 109 are made of resins such as TPX or PE, so that the microreactor 101 can be inexpensive and combustible. That is, the microreactor 101 can be manufactured for single use. The upper plate 108 and the lower plate 109 are overlapped such that the flow paths (the high-flow-rate side flow path 102, the branch flow paths 102a, 102b, the low-flow-rate side flow path 103, and the residence flow path 104) are formed therein. By irradiating the entire surface of the upper plate 108 with a laser light 401 from above the upper plate 108 (on the side of the upper plate 108), portions other than the flow paths are welded to form the microreactor 101.

Here, it is desirable that the cross-sectional areas of the high-flow-rate side flow path 102, the branch flow paths 102a, 102b, the low-flow-rate side flow path 103 and the residence flow path 104 are the same. In particular, since the flow path widths of each of the flow paths (the high-flow-rate side flow path 102, the branch flow paths 102a, 102b, the low-flow-rate side flow path 103, and the residence flow path 104) are set to be the same, and the flow path depths of each of the flow paths are set to be the same, the possibility that the flow path is buried during welding can be reduced.

As described above, in the first embodiment, the microreactor 101 and the chemical product manufacturing system 200 which have high production efficiency and safety when two or more types of raw materials are mixed at a high flow rate ratio (high volume ratio) can be provided.

The microreactor 101 having the effects of the first embodiment can be easily manufactured by the manufacturing method shown in FIG. 5.

The upper plate 108 and the lower plate 109 can be integrated by such a manufacturing method. Accordingly, leakage from each of the flow paths (the high-flow-rate side flow path 102, the branch flow paths 102a, 102b, the low-flow-rate side flow path 103 and the residence flow path 104) and contamination of foreign matters from the outside can be prevented, so that chemical products having high safety and high stability can be manufactured even in a case where highly corrosive substances and synthesis reactions requiring attention in handling are handled or in a case where cross-contamination may occur.

Second Embodiment

Hereinafter, a second embodiment will be described with reference to FIG. 6.

Figure 6:
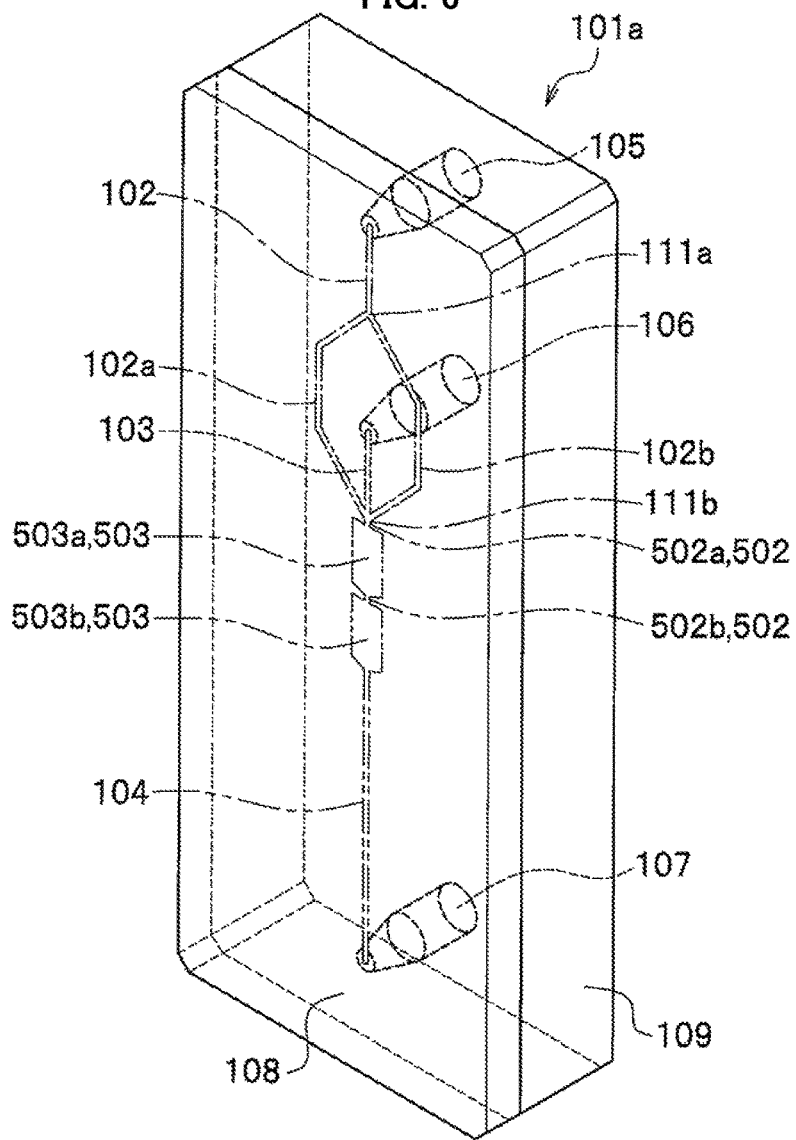
FIG. 6 is an external view of a microreactor according to a second embodiment.

FIG. 6 is an external view of a microreactor according to the second embodiment. In FIG. 6, the same reference numerals are attached to configurations similar to those of FIG. 1, and the descriptions thereof are omitted.

A microreactor 101a in FIG. 6 includes two orifices 502 (502a and 502b) and two abrupt expansion portions 503 (503a and 503b) based on the microreactor 101 in FIG. 1.

As shown in FIG. 6, a raw material on the high-flow-rate side is introduced into the high-flow-rate side flow path 102 from the high-flow-rate side introduction port 105. In addition, a raw material on the low-flow-rate side is introduced into the low-flow-rate side flow path 103 from the low-flow-rate side introduction port 106. The raw material on the high-flow-rate side is branched into two parts at the branch point 111a as the high-flow-rate side flow path 102 is branched into two branch flow paths 102a, 102b at the branch point 111a, then, similarly to the first embodiment, the two parts merge at the merging point 111b (refer to FIG. 7) in a way of sandwiching the raw material on the low-flow-rate side, and a mixture is formed. After the mixture was introduced into the first orifice 502a, the mixture is finally introduced into a residence flow path 104 via the first abrupt expansion portion 503a, the second orifice 502b, and the second abrupt expansion portion 503b. As a result, the obtained mixture is discharged from the discharge port 107.

The microreactor 101a is configured by the upper plate 108 and the lower plate 109. The high-flow-rate side flow path 102, branch flow paths 102a, 102b, the low-flow-rate side flow path 103, the residence flow path 104, the orifices 502 (502a and 502b), and the abrupt expansion portions 503 (503a and 503b) are formed on the upper plate 108. In addition, the high-flow-rate side introduction port 105, the low-flow-rate side introduction port 106 and the discharge port 107 are formed on the lower plate 109.

Figure 7:
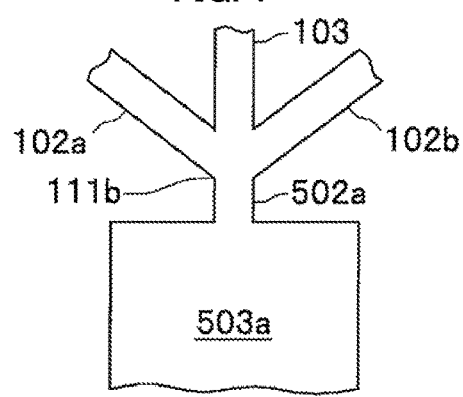
FIG. 7 is a view showing a detailed structure of an orifice.

FIG. 7 is a view showing a detailed structure of the orifice.

A configuration of the orifice 502a in FIG. 6 is shown in FIG. 7, and a configuration of the orifice 502b is similar to that of the orifice 502a. In FIG. 7, the same reference numerals are attached to configurations similarly to those of FIG. 6, and the descriptions thereof are omitted.

As shown in FIG. 7, a flow path of the orifice 502a is formed to be narrower than a flow path on an upstream side thereof. Further, the abrupt expansion portion 503a is disposed on a downstream side of the orifice 502a.

In order to perform mixing or a reaction satisfactorily, it is desirable to set the representative diameters of the highflow-rate side flow paths 102 (the branch flow paths 102a and 102b), the low-flow-rate side flow path 103, the residence flow path 104, the orifices 502a and 502b, and the flow paths of the abrupt expansion portions 503a and 503b to be 2 mm or less. In particular, in order to rapidly mix the raw materials by molecular diffusion in the merging point 111b, the residence flow path 104 and the orifices 502a, 502b, the representative diameters of flow paths are desired to be within a range of tens of μm to 1 mm. In the microreactor 101a, since the raw materials are atomized in the abrupt expansion portion 503 rearward than the orifice 502, it is desirable that two types of raw materials are formed into a non-uniform combination without being mixed, rather than being mixed uniformly. In the case of the non-uniform combination, the raw material with small amount on the low-flow-rate side is present in the raw material with large amount by the orifice 502 in a state of being atomized, which is a so-called emulsified state. As a result, the area of the raw material on the low-flow-rate side in contact with the raw material on the high-flow-rate side is increased, and a good reaction is promoted.

According to the microreactor 101a in accordance with the second embodiment, the reaction can be promoted by setting the raw materials having a low mixability in the emulsified state, in addition to effects similar to those of the microreactor 101 according to the first embodiment.

Third Embodiment

Hereinafter, a third embodiment will be described with reference to FIGS. 8 and 9.

Figure 8:
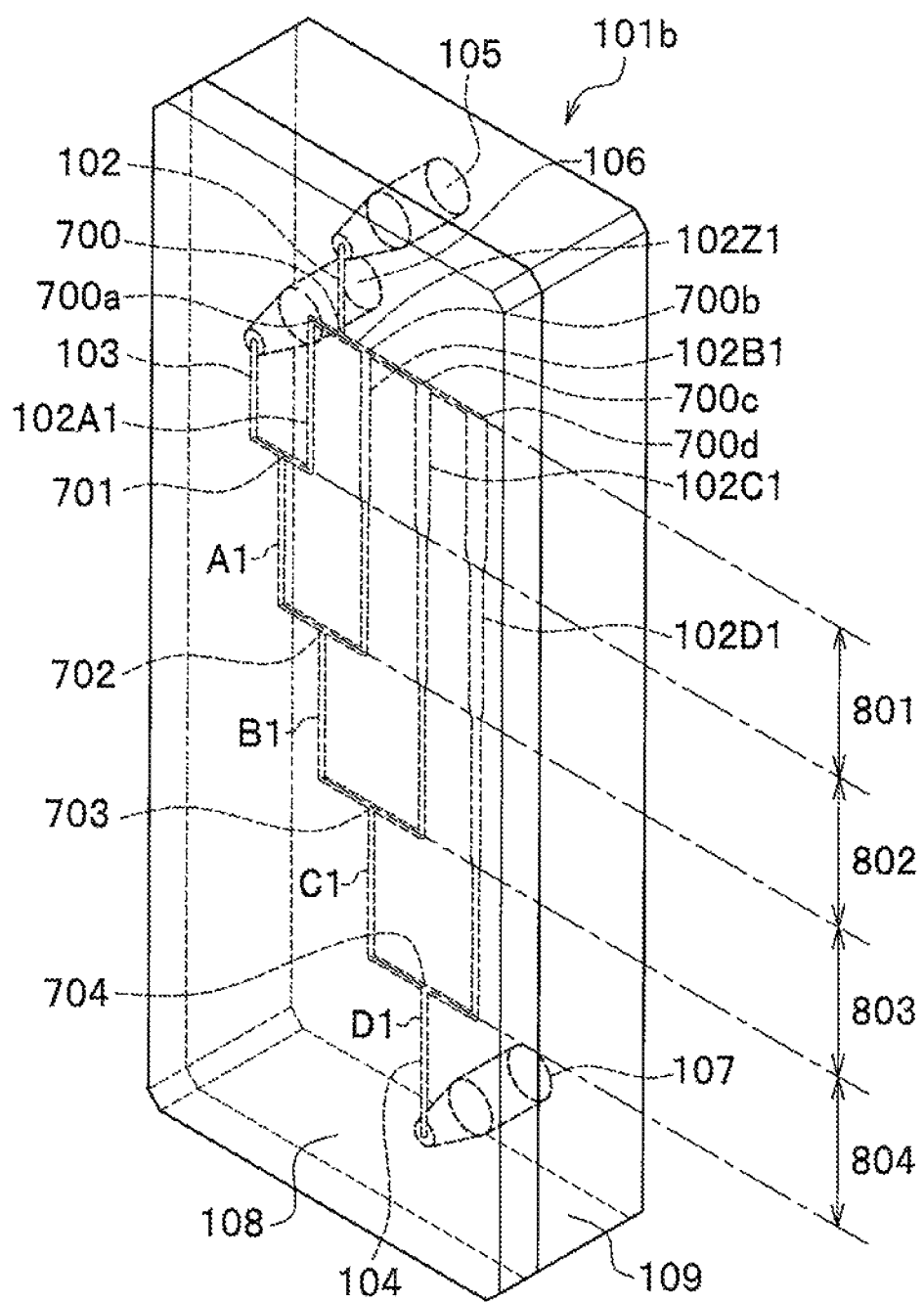
FIG. 8 is an external view of a microreactor according to a third embodiment.

FIG. 8 is an external view of a microreactor according to the third embodiment. In FIG. 8, the same reference numerals are attached to configurations similar to those of FIG. 1, and the descriptions thereof are omitted.

A microreactor 101b in FIG. 8 is configured by the high-flow-rate side flow path 102, a branch flow path 102Z1, branch flow paths 102A1 to 102D1, flow paths A1 to D1, the low-flow-rate side flow path 103, the residence flow path 104, the high-flow-rate side introduction port 105, the low-flow-rate side introduction port 106, and the discharge port 107.

As shown in FIG. 8, in the microreactor 101b, a raw material on the high-flow-rate side is introduced into the high-flow-rate side flow path 102 from the high-flow-rate side introduction port 105. In addition, a raw material on the low-flow-rate side is introduced into the low-flow-rate side flow path 103 from the low-flow-rate side introduction port 106. Further, the high-flow-rate side flow path 102 is branched into four branch flow paths 102A1 to 102D1. Consequently, the raw material on the high-flow-rate side is branched into four parts, and the four parts merge stepwise with the raw material on the low-flow-rate side or mixtures at merging points 701 to 704 respectively, so that a final mixture is formed. Subsequently, the final mixture is introduced into the residence flow path 104, and the obtained mixture is discharged from the discharge port 107.

Here, as shown in FIG. 8, the flow path from the high-flow-rate side introduction port 105 to a branch point 700 is defined as the high-flow-rate side flow path 102. Further, the flow path from a bend point 700a to a merging point 701 is defined as the branch flow path 102A1. The flow path from a branch point 700b to a merging point 702 is defined as the branch flow path 102B1. The flow path from a branch point 700c to a merging point 703 is defined as the branch flow path 102C1. The flow path from a bend point 700d to a merging point 704 is defined as the branch flow path 102D1. The flow path from the bend point 700a to the bend point 700d is defined as the branch flow path 102Z1.

In addition, the flow path from the merging point 701 to the merging point 702 is defined as a flow path A1, and the flow path from the merging point 702 to the merging point 703 is defined as a flow path B1. The flow path from the merging point 703 to the merging point 704 is defined as a flow path C1, and the flow path from the merging point 704 to the discharge port 107 is defined as a flow path D1. The flow path D1 is the residence flow path 104.

Further, the microreactor 101b is configured by two plates: the upper plate 108 and the lower plate 109. The high-flow-rate side flow path 102, the branch flow path 102Z1, the branch flow paths 102A1 to 102D1, the flow paths A1 to D1, the low-flow-rate side flow path 103, and the residence flow path 104 are formed on the upper plate 108. In addition, the high-flow-rate side introduction port 105, the low-flow-rate side introduction port 106, and the discharge port 107 are formed on the lower plate 109. According to the manufacturing method shown in FIG. 5, the upper plate 108 and the lower plate 109 are welded and integrated.

In the microreactor 101b, the flow paths having identical cross-sectional area merge at the merging points 701 to 704 of the branched raw materials on the high-flow-rate side respectively, and the cross-sectional area of the merged flow path does not change. Although the high-flow-rate side flow path 102 is branched into four branch paths 102A1 to 102D1 via the branch flow path 102Z1, the cross-sectional area of each of branch flow paths 102A1 to 102D1 is halved every time the flow paths merge respectively.

Hereinafter, it will be described in detail.

Although the case where the mixing volume ratio of the raw material on the high-flow-rate side and the raw material on the low-flow-rate side is 15:1 is shown as an example in the third embodiment, other mixing volume ratios may be used. It also applies to the fourth to the sixth embodiments.

Here, as shown in FIG. 8, the section from the branch point 700 to the first merging point 701 is defined as a section 801, and the section from the merging point 701 to the next merging point 702 is defined as a section 802. Further, the section from the merging point 702 to the next merging point 703 is defined as a section 803, and the section from the merging point 703 to the next merging point 704 is defined as a section 804.

Further, when the cross-sectional area of the low-flow-rate side flow path 103 is set to be one, it is desirable that the cross-sectional area of the branch flow path 102D1 in the section 801 is eight. It is desirable that the cross-sectional area of the branch flow path 102D1 in the section 802 is four. Further, it is desirable that the cross-sectional area of the branch flow path 102D1 in the section 803 is two, and the cross-sectional area of the branch flow path 102D1 in the section 804 is one.

In addition, when the cross-sectional area of the low-flow-rate side flow path 103 is set to be one, it is desirable that the cross-sectional area of the branch flow path 102C1 in the section 801 is four. Further, it is desirable that the cross-sectional area of the branch flow path 102C1 in the section 802 is two, and the cross-sectional area of the branch flow path 102C1 in the section 803 is one.

Further, when the cross-sectional area of the low-flow-rate side flow path 103 is set to be one, it is desirable that the cross-sectional area of the branch flow path 102B1 in the section 801 is two, and the cross-sectional area of the branch flow path 102B1 in the section 802 is one.

When the cross-sectional area of the low-flow-rate side flow path 103 is set to be one, it is desirable that the cross-sectional area of the branch flow path 102A1 in the section 801 is one.

Accordingly, in the third embodiment, it is desirable that the cross-sectional area of each of the branch flow paths 102B1 to 102D1 is halved for each of the sections 801 to 804 respectively. However, it is not necessary to strictly set the cross-sectional area to be the above-mentioned value. The cross-sectional area of the flow path from the high-flow-rate side introduction port 105 to the branch point 700 (the high-flow-rate side flow path 102) and the branch flow path 102Z1 may be any value.

As a result, the cross-sectional area of the flow path to be merged at each of the merging points 701 to 704 can be set to be same respectively. The raw materials with a similar flow rate ratio are easily mixed in the microreactor 101b, so that the cross-sectional area of the flow path to be merged at each of the merging points 701 to 704 is set to be same, and the cross-sectional area of each of the branch flow paths 102B1 to 102D1 is halved for each of the sections 801 to 804 respectively. Therefore, the pressure losses in the flow paths at the merging points 701 to 704 can be equalized.

Hereinafter, the description will be focused on the merging point 704.

For example, when it is assumed that the flow rate of each of the branch flow paths 102A1 to 102D1 is proportional to the cross-sectional area thereof in the section 801 respectively, the flow path C1 has a cross-sectional area same as that of the low-flow-rate side flow path 103, and the flow rate of the mixture flowing therethrough is eight which is the total flow rate of the low-flow-rate side flow path 103, the branch flow path 102A1, the branch flow path 102B1 and the branch flow path 102C1 when the flow rate flowing through the low-flow-rate side flow path 103 is set to be one. Meanwhile, the flow rate flowing in the branch flow path 102D1 is eight, and the cross-sectional area of the branch flow path 102D1 in the section 804 has a cross-sectional area same as the low-flow-rate side flow path 103. Therefore, since the branch flow path 102D1 and the flow path C1 in the section 804 have the same flow rate and same cross-sectional area, the pressure losses thereof are similar. It also applies to the other merging points 701 to 703.

In addition, for example, the flow path B1 has a cross-sectional area same as that of the low-flow-rate side flow path 103, and the flow rate of the flow path B1 is four which is the total flow rate of the low-flow-rate side flow path 103, the branch flow path 102A1 and the branch flow path 102B1, when the section 803 is focused on. The flow rate of the branch flow path 102C1 in the section 803 is four, and the cross-sectional area of the branch flow path 102C1 is same as that of the low-flow-rate side flow path 103. Therefore, in the section 803, the pressure loss in the flow path B1 is same as that in the branch flow path 102C1. Further, the flow rate of the branch flow path 102D1 is eight, and the cross-sectional area thereof in the section 803 is twice that of the low-flow-rate side flow path 103. Thus, in the section 803, the pressure loss in the branch flow path 102D1 is same as that in the flow path B1 and the branch flow path 102C1. It also applies to the other sections 801, 802 and 804.

Accordingly, in the microreactor 101b, the pressure losses in each of the flow paths A1 to D1 and in each of the branch flow paths 102A1 to 102D1 can be same for each of the sections 801 to 804. Accordingly, the raw material on the low-flow-rate side, the raw materials on the high-flow-rate side, and the mixtures can merge substantially simultaneously at the branch points 701 to 704 respectively.

Accordingly, a good mixing can be achieved.

In addition, the flow path internal volume of the high-flow-rate side flow path 102 becomes larger than that of the low-flow-rate side flow path 103 due to such branches of the high-flow-rate side flow path 102. Accordingly, the microreactor 101b has effects similar to those of the microreactor 101 according to the first embodiment.

Next, details of the merging state of the two types of raw materials, as viewed from above the upper plate 108 (on the side of the upper plate 108), will be described with reference to FIGS. 8 and 9. In order to make the merging state easily understood, in FIG. 9, the raw material 603 on the high-flow-rate side and the raw material 602 on the low-flow-rate side are described as not being mixed with each other. Actually, the raw material 603 on the high-flow-rate side and the raw material 602 on the low-flow-rate side are in a mixed state.

As shown in FIG. 8, the raw material 603 on the high-flow-rate side from the branch flow path 102A1 and the raw material 602 on the low-flow-rate side merge adjacently to each other in the flow path A1. As a result, as shown in FIG. 9, the raw material 602 on the low-flow-rate side and the raw material 603 on the high-flow-rate side are in an adjacent state in the flow path A1.

Further, in the flow path B1, the raw material 603 on the high-flow-rate side from the branch flow path 102B1 merges with, from the right side of the drawing, the mixture from the flow path A1. As a result, as shown in FIG. 9, the raw material 603 on the high-flow-rate side merges on, with respect to the state of the flow path A1, the right side of the drawing in the flow path B1.

Next, in the flow path C1, the raw material on the high-flow-rate side from the branch flow path 102C1 merges with, from the right side of the drawing, the mixture from the flow path B1. As a result, as shown in FIG. 9, the raw material 603 on the high-flow-rate side merges on, with respect to the state of the flow path B1, the right side of the drawing in the flow path C1.

Further, in the flow path D1, the raw material on the high-flow-rate side from the branch flow path 102D1 merges with, from the right side of the drawing, the mixture from the flow path C1. As a result, as shown in FIG. 9, the raw material 603 on the high-flow-rate side merges on, with respect to the state of the flow path C1, the right side of the drawing in the flow path D1.

Figure 9:
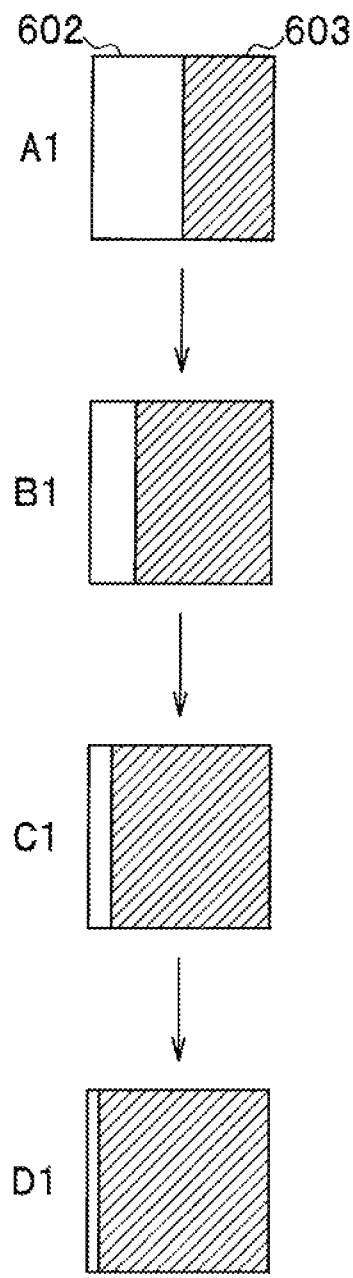
FIG. 9 is a view showing a state of mixing in a flow path of the microreactor according to the third embodiment.

As described above, in order to make the merging state easily understood, in FIG. 9, the raw material 603 on the high-flow-rate side and the raw material 602 on the low-flow-rate side are described as not being mixed with each other. Actually, the raw material 603 on the high-flow-rate side and the raw material 602 on the low-flow-rate side are in a mixed state. If the raw material 603 on the high-flow-rate side and the raw material 602 on the low-flow-rate side are not mixed, it can be said that the raw material 603 on the high-flow-rate side merges with, from the right side of the drawing, the raw material 602 on the low-flow-rate side.

It is desirable that the ratio, which is between the total flow path internal volume of the high-flow-rate side flow path 102, the branch flow paths 102A1 to 102D1 and flow paths A1 to D1, and the flow path internal volume of the low-flow-rate side flow path 103, is similar to the flow rate ratio (volume ratio) between the two types of raw materials. Further, it is desirable that the total pressure losses in the high-flow-rate side flow path 102, the branch flow paths 102A1 to 102D1 and the flow paths A1 to D1 are substantially equal to the pressure loss in the low-flow-rate side flow path 103.

Accordingly, the high-flow-rate side flow path 102 is branched into four flow paths in the microreactor 101b, so that the total flow path internal volume of the raw material on the high-flow-rate side becomes larger than the flow path internal volume of the low-flow-rate side flow path 103. For this reason, similarly to the first embodiment, the raw material on the high-flow-rate side can be prevented from flowing into the low-flow-rate side flow path 103 at the beginning of compound manufacture.

When an overall flow rate is high, the pressure loss may increase and the use of the microreactor may become difficult if the representative diameters of the flow paths are reduced in the microreactor 101 (refer to FIG. 1) and the microreactor 101a (refer to FIG. 6), and conversely the mixing efficiency may be worsened if the representative diameters of the flow paths are increased.

According to the microreactor 101b in accordance with the third embodiment, the raw materials 603 on the high-flow-rate side are merged stepwise, so that good mixing can be achieved even if the flow rate ratio between the raw material on the low-flow-rate side and the raw material on the high-flow-rate side is greatly different.

The desired mixture is obtained in the flow path D1 in the microreactor 101b, but the flow path D1 has a short length, so that it is desirable that only the mixing of the raw materials is performed in the microreactor 101b, the reaction is performed in the adjustment microreactor 301 (FIG. 4) or the like that is connected to the discharge port 107 of the microreactor 101b.

In order to perform the mixing satisfactorily, it is desirable that the representative diameters of the flow paths, the high-flow-rate side flow path 102, the branch flow paths 102A1 to 102D1, the flow paths A1 to D1, the low-flow-rate side flow path 103, and the residence flow path 104 in the microreactor 101b are set to be 2 mm or less. In particular, in order to rapidly mix the raw materials by molecular diffusion in the merging points 701 to 704 and the residence flow path 104, the representative diameters of flow paths are desired to be within a range of tens of μm to 1 mm. In addition, in the microreactor 101b, the two types of raw materials may be mixed uniformly, or may be non-uniform (may be the so-called emulsified state) without being mixed.

Although the high-flow-rate side flow path 102 is branched into four flow paths in the microreactor 101b, it may be branched into three, or five or more flow paths in accordance with the flow rate ratio (volume ratio) of the two types of raw materials. In general, as the flow rate ratio (volume ratio) of the two types of raw materials increases, it is desirable to increase the number of branches of the high-flow-rate side flow path 102.

Fourth Embodiment

Hereinafter, a fourth embodiment will be described with reference to FIGS. 10 and 11.

Figure 10:
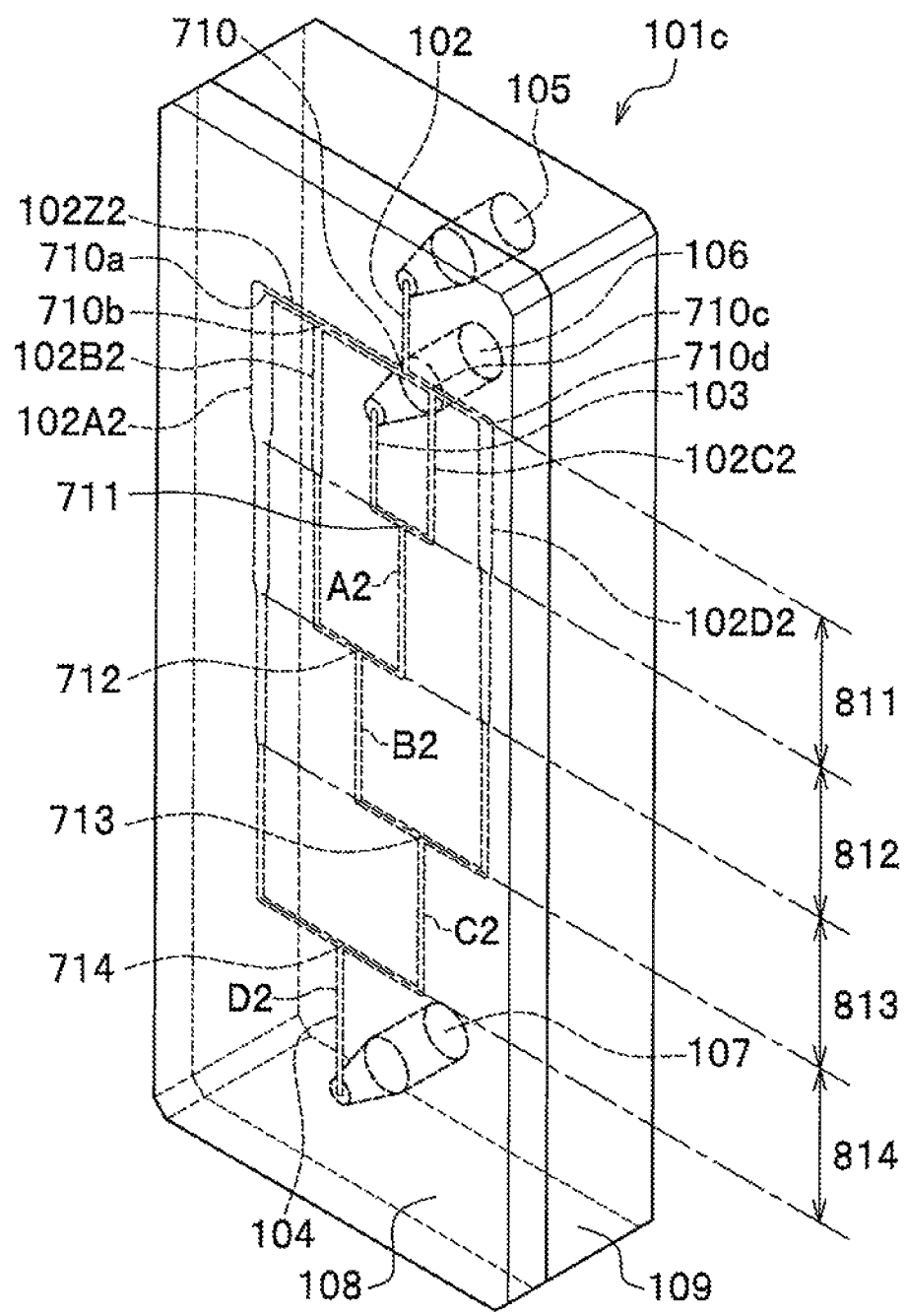
FIG. 10 is an external view of a microreactor according to a fourth embodiment.

FIG. 10 is an external view of a microreactor according to the fourth embodiment. In FIG. 10, the same reference numerals are attached to configurations similar to those of FIG. 1, and the descriptions thereof are omitted.

A microreactor 101c in FIG. 10 differs from the microreactor 101b in FIG. 6 in an arrangement of the branch flow paths of the high-flow-rate side flow path 102.

The microreactor 101c in FIG. 10 is configured by the high-flow-rate side flow path 102, a branch flow path 102Z2, branch flow paths 102A2 to 102D2, flow paths A2 to D2, the low-flow-rate side flow path 103, the residence flow path 104, the high-flow-rate side introduction port 105, the low-flow-rate side introduction port 106, and the discharge port 107.

As shown in FIG. 10, a raw material on the high-flow-rate side is introduced into the high-flow-rate side flow path 102 from the high-flow-rate side introduction port 105. In addition, a raw material on the low-flow-rate side is introduced into the low-flow-rate side flow path 103 from the low-flow-rate side introduction port 106. Here, the high-flow-rate side flow path 102 is branched into four branch flow paths 102A2 to 102D2. Consequently, the raw material on the high-flow-rate side is branched into four parts, and the raw materials on the high-flow-rate side merge stepwise with the raw material on the low-flow-rate side or mixtures, so that a final mixture is generated. Subsequently, the final mixture is finally introduced into the residence flow path 104, and the obtained mixture is discharged from the discharge port 107.

Here, as shown in FIG. 10, the flow path from the high-flow-rate side introduction port 105 to a branch point 710 is defined as the high-flow-rate side flow path 102. The flow path from a bend point 710a to a merging point 714 is defined as the branch flow path 102A2. The flow path from a branch point 710b to a merging point 712 is defined as the branch flow path 102B2. The flow path from a branch point 710c to a merging point 711 is defined as the branch flow path 102C2. Further, the flow path from a bend point 710d to a merging point 713 is defined as the branch flow path 102D2. The flow path from the bend point 710a to the bend point 710d is defined as the branch flow path 102Z2.

In addition, as shown in FIG. 10, the flow path from the merging point 711 to the merging point 712 is defined as a flow path A2, and the flow path from the merging point 712 to the merging point 713 is defined as a flow path B2. The flow path from the merging point 713 to the merging point 714 is defined as a flow path C2, and the flow path from the merging point 714 to the discharge port 107 is defined as a flow path D2. The flow path D2 is the residence flow path 104.

Further, the microreactor 101c is configured by two plates: the upper plate 108 and the lower plate 109. The high-flow-rate side flow path 102, the branch flow path 102Z2, the branch flow paths 102A2 to 102D2, the flow paths A2 to D2, the low-flow-rate side flow path 103, and the residence flow path 104 are formed on the upper plate 108. In addition, the high-flow-rate side introduction port 105, the low-flow-rate side introduction port 106, and the discharge port 107 are formed on the lower plate 109. According to the manufacturing method shown in FIG. 5, the upper plate 108 and the lower plate 109 are welded and integrated.

In the microreactor 101c, the flow paths having identical cross-sectional area merge at merging points 711 to 714 of the branched raw material on the high-flow-rate side respectively, and the cross-sectional area of the merged flow path does not change. Although the high-flow-rate side flow path 102 is branched into four branch paths 102A2 to 102D2 via the branch flow path 102Z2, the cross-sectional area of each of branch flow paths 102A2 to 102D2 is halved every time the flow paths merge respectively.

Hereinafter, it will be described in detail.

Here, as shown in FIG. 10, the section from the branch point 710 to the first merging point 711 is defined as a section 811, and the section from the merging point 711 to the next merging point 712 is defined as a section 812. Further, the section from the merging point 712 to the next merging point 713 is defined as a section 813, and the section from the merging point 713 to the next merging point 714 is defined as a section 814.

Further, when the cross-sectional area of the low-flow-rate side flow path 103 is set to be one, it is desirable that the cross-sectional area of the branch flow path 102A2 in the section 811 is eight. It is desirable that the cross-sectional area of the branch flow path 102A2 in the section 812 is four. Further, it is desirable that the cross-sectional area of the branch flow path 102A2 in the section 813 is two, and the cross-sectional area of the branch flow path 102A2 in the section 814 is one.

When the cross-sectional area of the low-flow-rate side flow path 103 is set to be one, it is desirable that the cross-sectional area of the branch flow path 102D2 in the section 811 is four. Further, it is desirable that the cross-sectional area of the branch flow path 102D2 in the section 812 is two, and the cross-sectional area of the branch flow path 102D2 in the section 813 is one.

Further, when the cross-sectional area of the low-flow-rate side flow path 103 is set to be one, it is desirable that the cross-sectional area of the branch flow path 102B2 in the section 811 is two, and the cross-sectional area of the branch flow path 102B2 in the section 812 is one.

When the cross-sectional area of the low-flow-rate side flow path 103 is set to be one, it is desirable that the cross-sectional area of the branch flow path 102C2 in the section 811 is one.

Accordingly, it is desirable that the cross-sectional areas of the branch flow paths 102A2, 102B2 and 102D2 are halved for the sections 811 to 814 respectively in the fourth embodiment. However, it is not necessary to strictly set the cross-sectional area to be the above-mentioned value. The cross-sectional areas of the flow path from the high-flow-rate side introduction port 105 to the branch point 710 (the high-flow-rate side flow path 102) and the branch flow path 102Z2 may be any value.

As a result, the cross-sectional area of the flow path to be merged at each of the merging points 711 to 714 can be set to be same respectively. The raw materials with a similar flow rate ratio are easily mixed in the microreactor 101b, so that the cross-sectional area of the flow path to be merged at each of the merging points 711 to 714 is set to be same. Therefore, the pressure losses in the flow paths at the merging points 711 to 714 can be equalized. Since the reason why the pressure losses in the flow paths at the merging points 711 to 714 can be equalized has already been described in the third embodiment, the description here is omitted. Accordingly, good mixing can be achieved.

In addition, the flow path internal volume of the high-flow-rate side flow path 102 becomes larger than that of the low-flow-rate side flow path 103 due to such branches of the high-flow-rate side flow path 102. Accordingly, the microreactor 101c can obtain effects similar to those of the microreactor 101 shown in FIG. 1.

Next, details of the merging state of two types of raw materials, as viewed from above the upper plate 108 (on the side of the upper plate 108), will be described with reference to FIGS. 10 and 11. In order to make the merging state easily understood, in FIG. 11, the raw material 603 on the high-flow-rate side and the raw material 602 on the low-flow-rate side are described as not being mixed with each other. Actually, the raw material 603 on the high-flow-rate side and the raw material 602 on the low-flow-rate side are in a mixed state.

As shown in FIG. 10, the raw material 603 on the high-flow-rate side from the branch flow path 102C2 and the raw material 602 on the low-flow-rate side merge adjacently to each other in the flow path A2. As a result, as shown in FIG. 11, the raw material 602 on the low-flow-rate side and the raw material 603 on the high-flow-rate side are in an adjacent state in the flow path A2.

In addition, in the flow path B2, the raw material 603 on the high-flow-rate side from the branch flow path 102B2 merges with, from the left side of the drawing, the mixture from the flow path A2. As a result, as shown in FIG. 11, the raw material 603 on the high-flow-rate side merges on, with respect to the state of the flow path A2, the left side of the drawing in the flow path B2.

Further, in the flow path C2, the raw material on the high-flow-rate side from the branch flow path 102D2 merges with, from the right side of the drawing, the mixture from the flow path B2. As a result, as shown in FIG. 11, the raw material 603 on the high-flow-rate side merges on, with respect to the state of the flow path B2, the right side of the drawing in the flow path C2.

Further, in the flow path D2, the raw material on the high-flow-rate side from the branch flow path 102A2 merges with, from the left side of the drawing, the mixture from the flow path C2. As a result, as shown in FIG. 11, the raw material 603 on the high-flow-rate side merges on, with respect to the state of the flow path C2, the left side of the drawing in the flow path D2 (the residence flow path 104).

Figure 11:
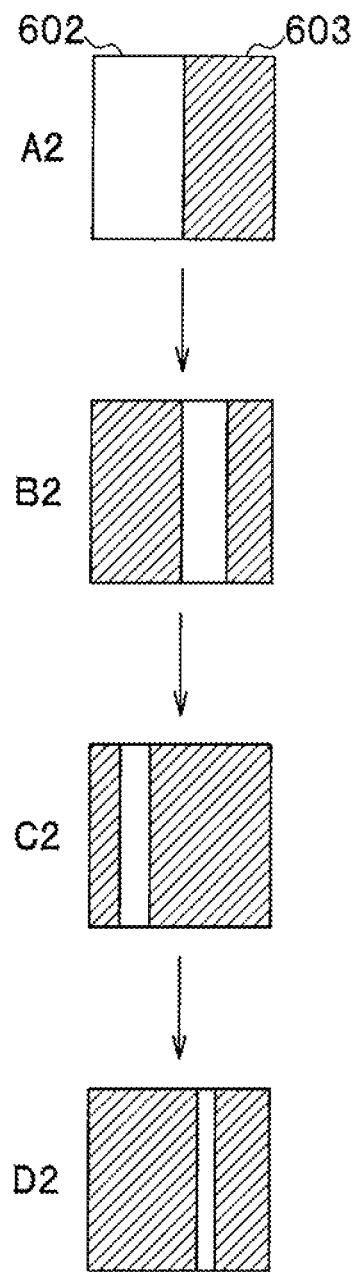
FIG. 11 is a view showing a state of mixing in a flow path of the microreactor according to the fourth embodiment.

As described above, the raw material 603 on the high-flow-rate side and the raw material 602 on the low-flow-rate side are not separated (are mixed), but in FIG. 11, the raw material 603 on the high-flow-rate side and the raw material 602 on the low-flow-rate side are described as not being mixed in order to make the merging state easily understood. If the raw material 603 on the high-flow-rate side and the raw material 602 on the low-flow-rate side are not mixed, it can be said that the raw material 603 on the high-flow-rate side alternately merges with, from the left-right direction of the drawing, the raw material 602 on the low-flow-rate side.

It is desirable that the ratio, between the total flow path internal volume of the high-flow-rate side flow path 102, the branch flow paths 102A2 to 102D2 and flow paths A2 to D2, and the flow path internal volume of the low-flow-rate side flow path 103, is similar to the flow rate ratio (volume ratio) between the two types of raw materials. Further, it is desirable that the total pressure losses in flow paths, the high-flow-rate side flow path 102, the branch flow paths 102A2 to 102D2 and the flow paths A2 to D2 is substantially equal to the pressure loss in the low-flow-rate side flow path 103.

When the overall flow rate of the raw material on the high-flow-rate side is high, the pressure loss may increase and the use of the microreactor may become difficult if the representative diameters of the flow paths are reduced in the microreactor 101 (refer to FIG. 1) and the microreactor 101a (refer to FIG. 6), and conversely the mixing efficiency may be worsened if the representative diameters of the flow paths are increased.

According to the microreactor 101c in accordance with the fourth embodiment, the raw materials 603 on the high-flow-rate side are merged stepwise, so that favorable mixing can be achieved even if the flow rate ratio between the raw material on the low-flow-rate side and the raw material on the high-flow-rate side is greatly different.

The desired mixture is obtained in the flow path D2 in the microreactor 101c, but the flow path D2 has a short length, so that it is desirable that only the mixing of the raw materials is performed in the microreactor 101c, the reaction is performed in the adjustment microreactor 301 (FIG. 4) or the like that is connected to the discharge port 107 of the microreactor 101c.

In order to perform the mixing satisfactorily, it is desirable that the representative diameters of the flow paths, the high-flow-rate side flow path 102, the branch flow paths 102A2 to 102D2, the flow paths A2 to D2, the low-flow-rate side flow path 103, and the residence flow path 104 in the microreactor 101c are set to be 2 mm or less. In particular, in order to rapidly mix the raw materials by molecular diffusion in the merging points 711 to 714 and the residence flow path 104, the representative diameters of the flow paths are desired to be within a range of tens of µm to 1 mm. In addition, in the microreactor 101c, the two types of raw materials may be mixed uniformly, or may be non-uniform (in the so-called emulsified state) without being mixed.

Accordingly, the high-flow-rate side flow path 102 is branched into four flow paths in the microreactor 101c, so that the total flow path internal volume of the raw materials on the high-flow-rate side becomes larger than the flow path internal volume of the low-flow-rate side flow path 103. For this reason, similarly to the first embodiment, the raw material on the high-flow-rate side can be prevented from flowing into the low-flow-rate side flow path 103 at the beginning of compound manufacture.

In addition, the high-flow-rate side flow path 102 is branched into four flow paths, and stepwise merge from the left-right direction of the drawing with respect to the raw material on the low-flow-rate side, so that the interfacial area of the two types of raw materials is increased, compared with conventional microreactors (not the microreactor of the present embodiment), and the mixing efficiency can be improved even if the structure is not such fine.

Further, since the raw materials 603 on the high-flow-rate side alternately merge from the left-right direction of the drawing in the microreactor 101c as shown in FIG. 11, the mixing efficiency can be improved compared with the microreactor 101b (refer to FIG. 8).

Although the high-flow-rate side flow path 102 is branched into four flow paths in the microreactor 101c, it may be branched into three, or five or more flow paths in accordance with the flow rate ratio (volume ratio) of the two types of raw materials. In general, as the flow rate ratio (volume ratio) of the two types of raw materials increases, it is desirable to increase the number of branches of the high-flow-rate side flow path 102.

Fifth Embodiment

Hereinafter, a fifth embodiment will be described with reference to FIGS. 12 to 15.

Figure 12:
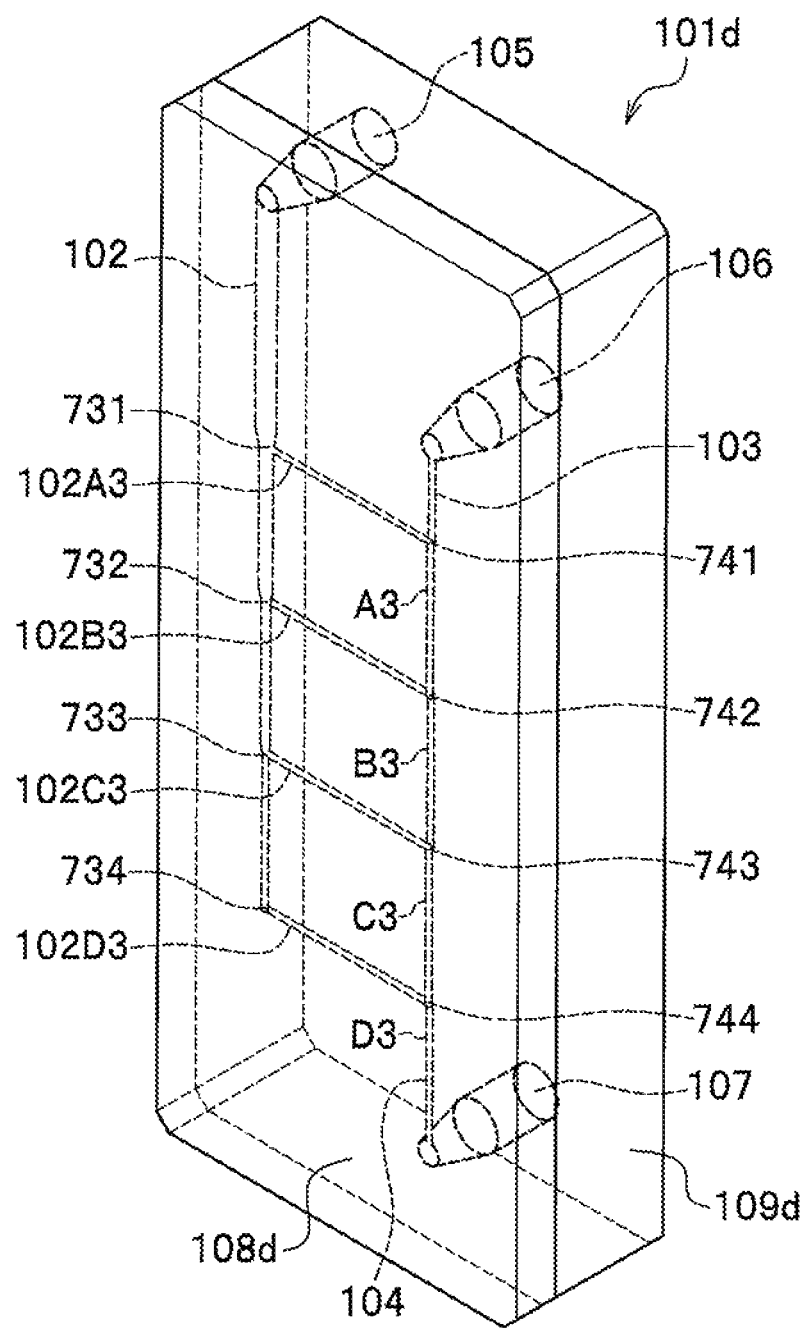
FIG. 12 is an external view of a microreactor according to a fifth embodiment.
Figure 13:
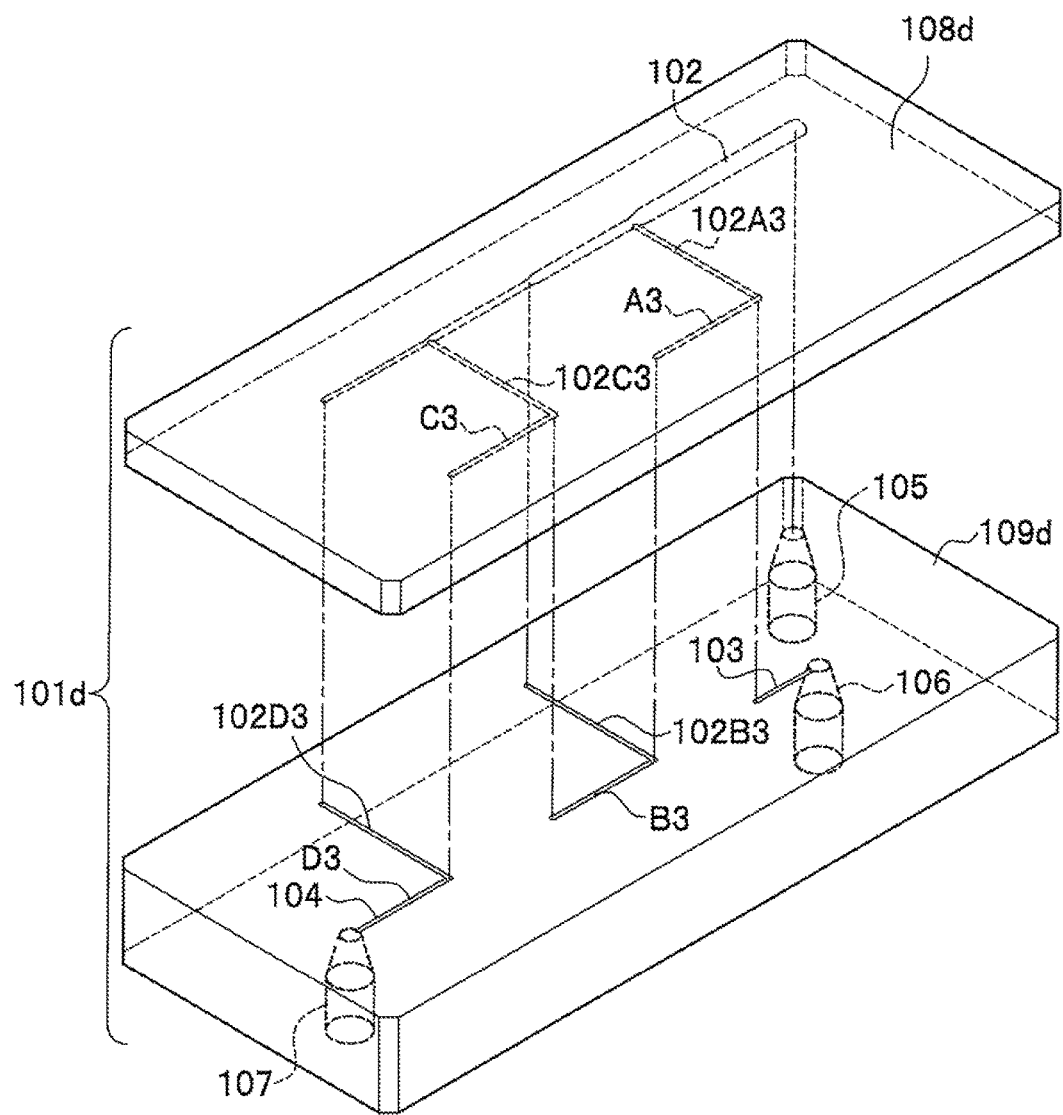
FIG. 13 is an exploded view of the microreactor according to the fifth embodiment.

FIG. 12 is an external view of a microreactor according to the fifth embodiment. FIG. 13 is an exploded view of the microreactor according to the fifth embodiment. In FIGS. 12 and 13, the same reference numerals are attached to configurations similar to those of FIG. 1, and the descriptions thereof are omitted.

As shown in FIG. 12, in the microreactor 101d, a raw material on the high-flow-rate side is introduced into the high-flow-rate side flow path 102 from the high-flow-rate side introduction port 105. In addition, a raw material on the low-flow-rate side is introduced into the low-flow-rate side flow path 103 from the low-flow-rate side introduction port 106. Here, as the high-flow-rate side flow path 102 is branched into four branch flow paths 102A3 to 102D3, the raw material on the high-flow-rate side is branched into four parts. Further, the raw materials on the high-flow-rate side merge stepwise with the raw material on the low-flow-rate side or a mixture in flow paths A3 to D3 respectively, so that a final mixture is formed. The final mixture is introduced into the residence flow path 104, and is discharged from the discharge port 107.

In addition, the cross-sectional area of the high-flow-rate side flow path 102 is reduced every time the flow path is branched.

Here, the flow path from the high-flow-rate side introduction port 105 to a bend point 734 is defined as the high-flow-rate side flow path 102. In addition, the flow path from a branch point 731 to a merging point 741 is defined as a branch flow path 102A3, and the flow path from a merging point 732 to a merging point 742 is defined as a branch flow path 102B3. The flow path from a branch point 733 to a merging point 743 is defined as a branch flow path 102C3, and the flow path from a bend point 734 to a merging point 744 is defined as a branch flow path 102D3.

Further, the flow path from a merging point 741 to a merging point 742 is defined as a flow path A3, and the flow path from a merging point 742 to a merging point 743 is defined as a flow path B3. Further, the flow path from a merging point 743 to a merging point 744 is defined as a flow path C3, and the flow path from a merging point 744 to the discharge port 107 is defined as a flow path D3. The flow path D3 is also the residence flow path 104.

Further, as shown in FIGS. 12 and 13, the microreactor 101d is configured by two plates: an upper plate 108d and a lower plate 109d. The high-flow-rate side flow path 102, the branch flow paths 102A3 and 102C3, and the flow paths A3 and C3 are formed on the upper plate 108d. In addition, the low-flow-rate side flow path 103, the branch flow paths 102B3 and 102D3, and the flow paths B3 and D3 (the residence flow path 104) are formed on the lower plate 109d. In addition, the high-flow-rate side introduction port 105, the low-flow-rate side introduction port 106, and the discharge port 107 are formed on the lower plate 109d.

Further, the upper plate 108d and the lower plate 109d are integrated by welding according to the manufacturing method shown in FIG. 5.

In the microreactor 101d, the flow paths having identical cross-sectional area merge in the flow paths A3 to D3 respectively, and the cross-sectional area of the merged flow path does not change. It is desirable that the cross-sectional area of the high-flow-rate side flow path 102 is halved every time the flow path is branched. That is, when the cross-sectional area of the low-flow-rate side flow path 103 is set to be one, it is desirable that the cross-sectional area of the high-flow-rate side flow path 102 is eight before being branched to the branch flow path 102A3, four before being branched to the branch flow path 102B3, two before being branched to the branch flow path 102C3, and one before being branched to the branch flow path 102D3. It is desirable that the cross-sectional areas of the branch flow paths 102A3 to 102D3, and the flow paths A3 to D3 are same as that of the low-flow-rate side flow path 103. As a result, the flow rate in the branch flow paths 102A3 to 102D3 can be identical to the flow rate in the low-flow-rate side flow path 103, and the pressure losses in the branch flow paths 102A3 to 102D3 and the low-flow-rate side flow path 103 can be equalized.

In addition, the total flow path internal volume of the high-flow-rate side flow path 102, the branch flow paths 102A3 to 102D3 and the flow paths A3 to D3 becomes larger than the flow path internal volume of the low-flow-rate side flow path 103 due to such branches of the high-flow-rate side flow path 102. The cross-sectional area of the high-flow-rate side flow path 102 does not have to be strictly halved every time the flow path is branched.

It is desirable that the ratio, between the total flow path internal volume of the high-flow-rate side flow path 102, the branch flow paths 102A3 to 102D3 and the flow paths A3 to D3, and the flow path internal volume of the low-flow-rate side flow path 103, is similar to the flow rate ratio (volume ratio) between the two types of raw materials. Further, it is desirable that the pressure losses in the flow paths of the raw material on the high-flow-rate side (the high-flow-rate side flow path 102, the branch flow paths 102A3 to 102D3 and the flow paths A3 to D3) are substantially equal to the pressure loss in the low-flow-rate side flow path 103. It also applies to the sixth embodiment described below.

Next, a state where the two types of raw materials merge will be described with reference to FIGS. 14 and 15.

Figure 14:
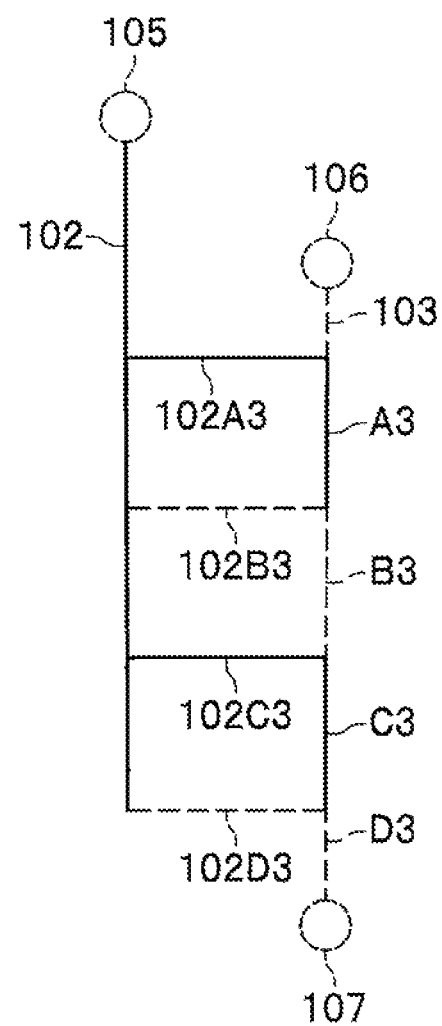
FIG. 14 is a schematic view of a flow path of the microreactor according to the fifth embodiment.

FIG. 14 is a schematic diagram of each flow path in the microreactor 101*d*. FIG. 15 is a diagram showing the mixing states in the flow paths A3 to D3, as viewed from the upstream side of the flow paths. In FIG. 14, the flow path formed in the upper plate 108*d* is shown by a solid line, and the flow path formed in the lower plate 109*d* is shown by a broken line. In FIG. 14, the same reference numerals are attached to configurations similar to those of FIG. 12, and the descriptions thereof are omitted. In addition, FIG. 14 does not clearly show the cross-sectional area variation of the high-flow-rate side flow path 102.

Figure 15:
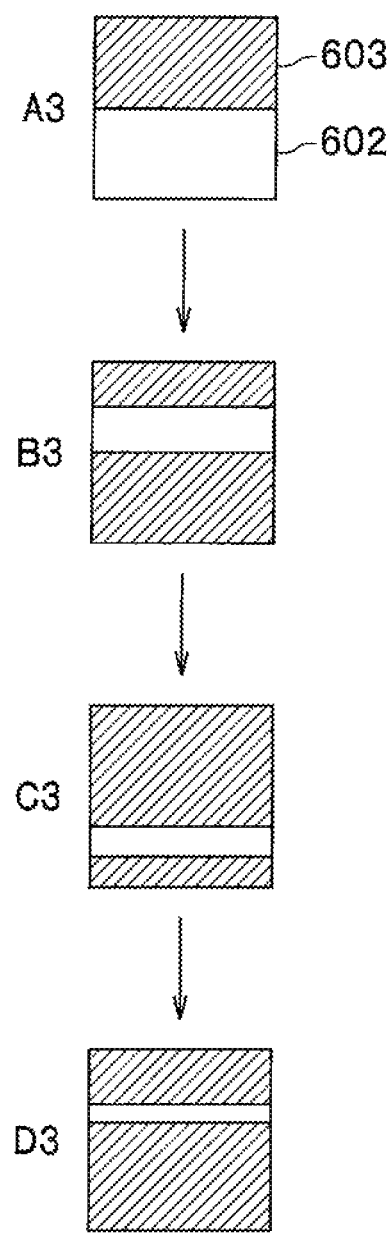
FIG. 15 is a view showing a state of mixing in the flow path of the microreactor according to the fifth embodiment.

In addition, the raw material 603 on the high-flow-rate side and the raw material 602 on the low-flow-rate side are mixed actually, but in FIG. 15, the raw material 603 on the high-flow-rate side and the raw material 602 on the low-flow-rate side are described as not being mixed in order to make the merging state easily understood, similarly to the above description.

As shown in FIG. 14, in the flow path A3 formed in the upper plate 108*d*, the raw material 603 on the high-flow-rate side from the branch flow path 102A3 formed in the upper plate 108*d* merges with the raw material 602 on the low-flow-rate side from the low-flow-rate side flow path 103 formed in the lower plate 109*d*. For this reason, as shown in FIG. 15, in the flow path A3, the raw material 603 on the high-flow-rate side which is on the upper side of the drawing and the raw material 602 on the low-flow-rate side which is on the lower side of the drawing, flow through the upper plate 108*d* in an adjacent state.

Subsequently, as shown in FIG. 14, in the flow path B3 formed in the lower plate 109*d*, the raw material 603 on the high-flow-rate side and the branch flow path 102B3 formed in the lower plate 109*d*, merges with the mixture from the flow path A3 formed in the upper plate 108*d*. Accordingly, as shown in FIG. 15, in the flow path B3, the raw material 603 on the high-flow-rate side flow through the lower plate 109*d* in an adjacent state, from the lower side of the drawing, to the mixture in the flow path A3 on the upper side.

Further, as shown in FIG. 14, in the flow path C3 formed in the upper plate 108*d*, the material on the high-flow-rate side from the branch flow path 102C3 formed in the upper plate 108*d* merges with the mixture in the flow path B3 formed in the lower plate 109*d*. Accordingly, as shown in FIG. 15, in the flow path C3, the raw material 603 on the high-flow-rate side flows through the upper plate 108*d* in an adjacent state, from the upper side of the drawing, to the mixture in the flow path B3 on the lower side.

Further, as shown in FIG. 14, in the flow path D3 formed in the lower plate 109*d*, the raw material on the high-flow-rate side from the branch flow path 103D3 formed in the lower plate 109*d* merges with the mixture from the flow path C3 formed in the upper plate 108*d*. Accordingly, as shown in FIG. 15, in the flow path D3 (the residence flow path 104), the raw material 603 on the high-flow-rate side flows through, with respect to the state of the flow path C3 on the upper side, the lower plate 109*d* in an adjacent state from the lower side of the drawing.

As described above, the raw material 603 on the high-flow-rate side and the raw material 602 on the low-flow-rate side are mixed actually, but in FIG. 15, the raw material 603 on the high-flow-rate side and the raw material 602 on the low-flow-rate side are described as not being mixed in order to make the merging state easily understood, similarly to the above description. If the raw material 603 on the high-flow-rate side and the raw material 602 on the low-flow-rate side are not mixed, it can be said that the raw materials 603 on the high-flow-rate side merge in a way of sandwiching the raw material 602 on the low-flow-rate side from the upper-lower direction of the drawing.

The microreactor 101*d* according to the fifth embodiment has a merge direction different from that of the microreactor 101*b* (FIG. 8) and the microreactor 101*c* (FIG. 10), but the microreactor 101*d* enables mixing more efficient than the microreactor 101*b* and the microreactor 101*c* since the raw materials 603 on the high-flow-rate side stepwise and alternately merge from the upper-lower direction of the drawing.

In order to obtain good mixing, it is desirable that the representative diameters of the flow paths A3 to C3, and D3 (the residence flow path 104) in the microreactor 101*d* are set to be 2 mm or less. In particular, in order to rapidly mix the raw materials by molecular diffusion in the merging points 741 to 744, and the residence flow path 104, the representative diameters of flow paths are desired to be within a range of tens of μm to 1 mm. In addition, in the microreactor 101*d*, the two types of raw materials may be mixed uniformly, or may be non-uniform (in the so-called emulsified state) without being mixed.

Although the high-flow-rate side flow path 102 is branched into four flow paths in the microreactor 101*d* according to the fifth embodiment, it may be branched into three, or five or more flow paths in accordance with the flow rate ratio (volume ratio) of the two types of raw materials. In general, as the flow rate ratio (volume ratio) of the two types of raw materials increases, it is desirable to increase the number of branches of the high-flow-rate side flow path 102.

Sixth Embodiment

Hereinafter, a sixth embodiment will be described with reference to FIGS. 16 to 19.

Figure 16:
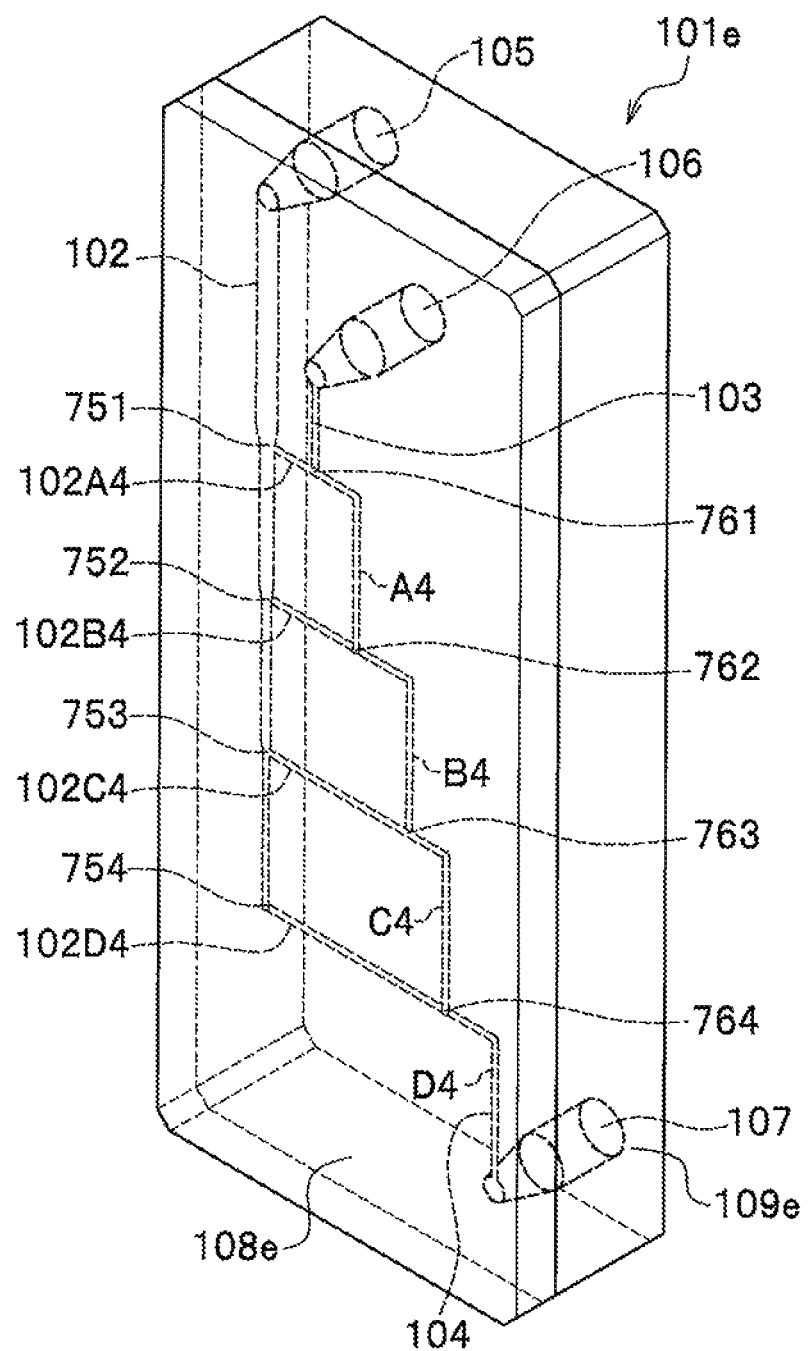
FIG. 16 is an external view of a microreactor according to a sixth embodiment.
Figure 17:
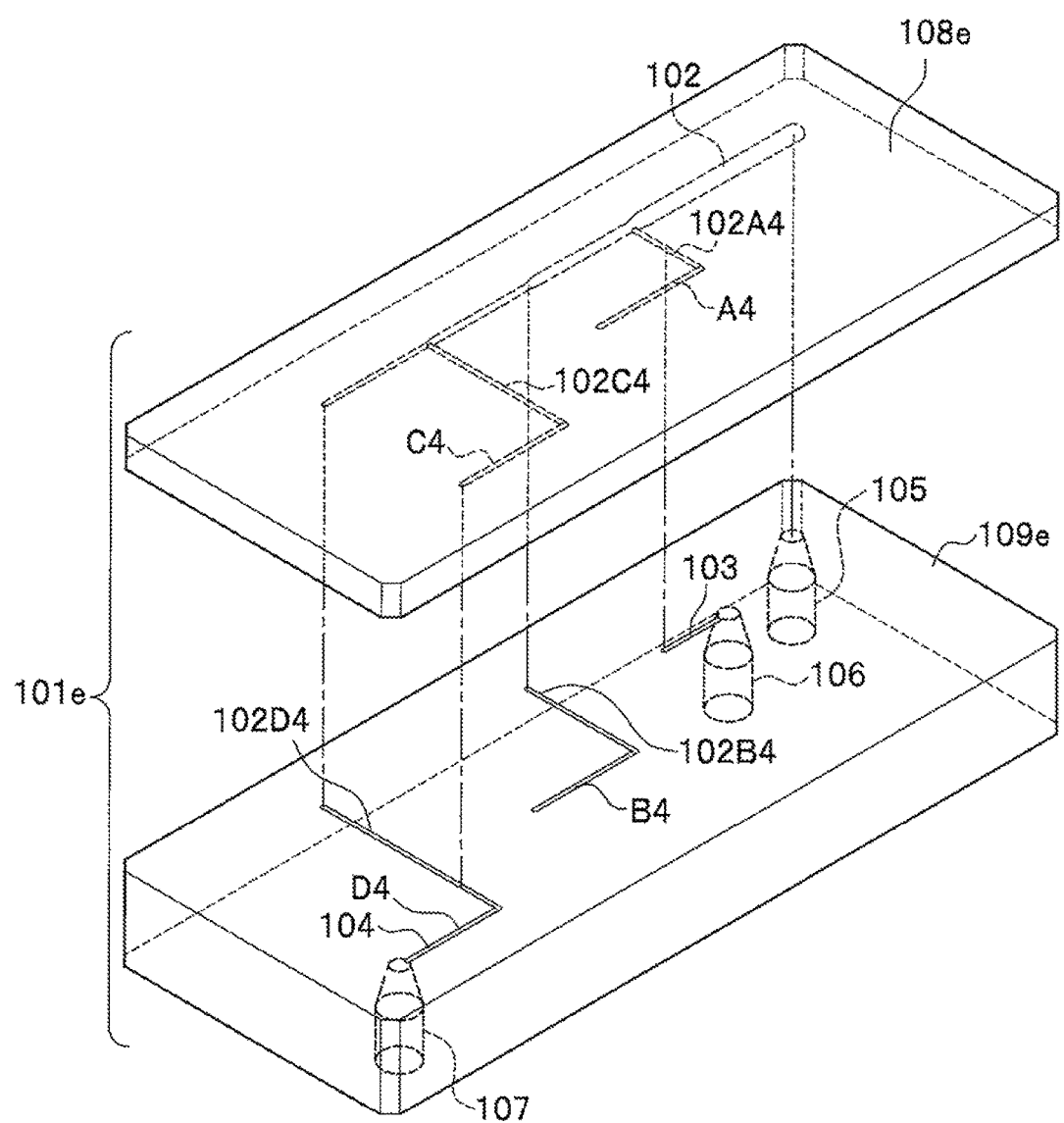
FIG. 17 is an exploded view of the microreactor according to the sixth embodiment.

FIG. 16 is an external view of a microreactor according to the sixth embodiment. FIG. 17 is an exploded view of the microreactor according to the sixth embodiment. In FIGS. 16 and 17, the same reference numerals are attached to configurations similar to those of FIG. 1, and the descriptions thereof are omitted.

A microreactor 101*e* in FIG. 16 differs from the microreactor 101*d* shown in FIG. 12 in the direction of the flow path rearward than merging points 761 to 764.

As shown in FIG. 16, the microreactor 101*e* is configured by the high-flow-rate side flow path 102, the low-flow-rate side flow path 103, the residence flow path 104, the high-flow-rate side introduction port 105, the low-flow-rate side introduction port 106, and the discharge port 107.

As shown in FIG. 16, a raw material on the high-flow-rate side is introduced into the high-flow-rate side flow path 102 from the high-flow-rate side introduction port 105. A raw material on the low-flow-rate side is introduced into the low-flow-rate side flow path 103 from the low-flow-rate side introduction port 106. In addition, the high-flow-rate side flow path 102 is branched into four branch flow paths 102A4 to 102D4. Further, the raw materials on the high-flow-rate side merge stepwise with the raw material on the low-flow-rate side or a mixture in flow paths A4 to D4 respectively, so that a final mixture is formed. The final mixture is introduced into the residence flow path 104 and is discharged from the discharge port 107.

In addition, the cross-sectional area of the high-flow-rate side flow path 102 is reduced every time the flow path is branched.

Here, the flow path from the high-flow-rate side introduction port 105 to a bend point 754 is defined as the high-flow-rate side flow path 102. In addition, the flow path from a branch point 751 to a merging point 761 is defined as a branch flow path 102A4, and the flow path from a merging point 752 to a merging point 762 is defined as a branch flow path 102B4. In addition, the flow path from a branch point 753 to a merging point 763 is defined as a branch flow path 102C4, and the flow path from the bend point 754 to a merging point 764 is defined as a branch flow path 102D4.

Further, the flow path from a merging point 761 to a merging point 762 is defined as a flow path A4, and the flow path from a merging point 762 to a merging point 763 is defined as a flow path B4. Further, the flow path from a merging point 763 to a merging point 764 is defined as a flow path C4, and the flow path from a merging point 764 to the discharge port 107 is defined as a flow path D4. The flow path D4 is also the residence flow path 104.

Further, as shown in FIGS. 16 and 17, the microreactor 101e is configured by two plates: an upper plate 108e and a lower plate 109e. The high-flow-rate side flow path 102, the branch flow paths 102A4 and 102C4, and the flow paths A4 and C4 are formed on the upper plate 108e. In addition, the low-flow-rate side flow path 103, the branch flow paths 102B4 and 102D4, and the flow paths B4 and D4 (the residence flow path 104) are formed on the lower plate 109e. The high-flow-rate side introduction port 105, the low-flow-rate side introduction port 106, and the discharge port 107 are formed on the lower plate 109e.

Further, the upper plate 108e and the lower plate 109e are welded and integrated according to the manufacturing method shown in FIG. 5.

In the microreactor 101e, the flow paths having identical cross-sectional area merge in the flow paths A4 to D4 respectively, and the cross-sectional area of the merged flow path does not change. The cross-sectional area of the high-flow-rate side flow path 102 is halved every time the flow path is branched. That is, when the cross-sectional area of the low-flow-rate side flow path 103 is set to be one, it is desirable that the cross-sectional area of the high-flow-rate side flow path 102 is eight before being branched to the branch flow path 102A4, four before being branched to the branch flow path 102B4, two before being branched to the branch flow path 102C4, and one before being branch to the branch flow path 102D4. It is desirable that the cross-sectional areas of the branch flow paths 102A4 to 102D4, and the flow paths A4 to D4 are same as that of the low-flow-rate side flow path 103 respectively. As a result, the flow rates in the branch flow paths 102A4 to 102D4 can be same as the flow rate in the low-flow-rate side flow path 103 respectively, and the pressure losses in the branch flow paths 102A4 to 102D4 and the low-flow-rate side flow path 103 can be equalized.

In addition, the total flow path internal volume of the high-flow-rate side flow path 102, the branch flow paths 102A4 to 102D4 and flow paths A4 to D4 becomes larger than the flow path internal volume of the low-flow-rate side flow path 103, due to such branches of the high-flow-rate side flow path 102. The cross-sectional area of the high-flow-rate side flow path 102 does not have to be strictly halved every time the flow path is branched.

It is desirable that the ratio, between the total flow path internal volume of the high-flow-rate side flow path 102, the branch flow paths 102A4 to 102D4 and flow paths A4 to D4, and the flow path internal volume of the low-flow-rate side flow path 103, is similar to the flow rate ratio (volume ratio) between the two types of raw materials. Further, it is desirable that the pressure losses in the flow paths of the raw material on the high-flow-rate side (the high-flow-rate side flow path 102, the branch flow paths 102A4 to 1024 and flow paths A4 to D4) are substantially equal to the pressure loss in the low-flow-rate side flow path 103.

The flow paths A4 to D4 move in the extension line direction of the branch flow paths 102A4 to 102D4 respectively only by a predetermined distance after merging, and then move towards the direction of the discharge port 107. The microreactor 101e makes the flow of the mixture after each merging smoother than that of the microreactor 101d shown in FIG. 12 by adopting such a configuration.

Next, a state where the two types of raw materials merge will be described with reference to FIGS. 18 and 19.

Figure 18:
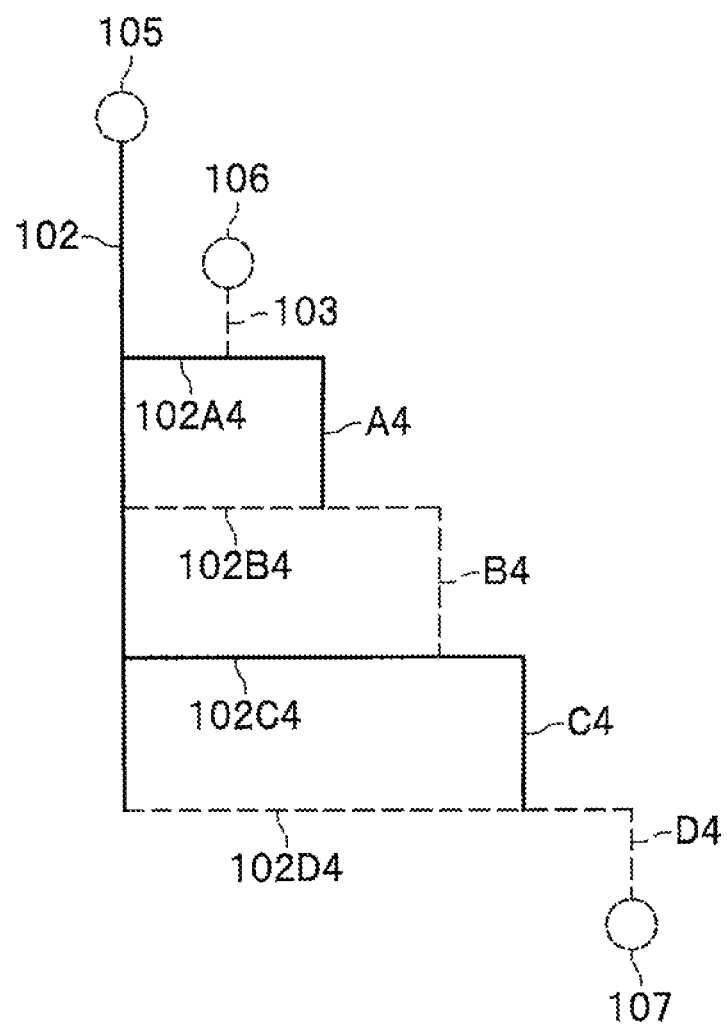
FIG. 18 is a schematic view of a flow path of the microreactor according to the sixth embodiment.

FIG. 18 is a schematic diagram of each flow path in the microreactor 101e. FIG. 19 is a diagram showing the mixing states in the flow paths A4 to D4 as viewed from the upstream side of the flow paths. In FIG. 18, the flow path formed in the upper plate 108e is shown by a solid line, and the flow path formed in the lower plate 109e is shown by a broken line. In addition, in FIG. 18, the same reference numerals are attached to configurations similar to those of FIG. 16, and the descriptions thereof are omitted. FIG. 18 does not specify the cross-sectional area of each flow path.

As shown in FIG. 18, in the flow path A4 formed in the upper plate 108e, the raw material 603 on the high-flow-rate side from the branch flow path 102A4 formed in the upper plate 108e is adjacent to and merges with the raw material 602 on the low-flow-rate side from the low-flow-rate side flow path 103 formed in the lower plate 109e. For this reason, as shown in FIG. 19, in the flow path A4 formed in the upper plate 108e, the raw material 603 on the high-flow-rate side that is on the upper side of the drawing and the raw material 602 on the low-flow-rate side that is on the lower side of the drawing flow through the upper plate 108e in an adjacent state.

Subsequently, as shown in FIG. 18, in the flow path B4 formed in the lower plate 109e, the raw material 603 on the high-flow-rate side from the branch flow path 102B4 formed in the lower plate 109e, merges with the mixture from the flow path A4 formed in the upper plate 108e.

Figure 19:
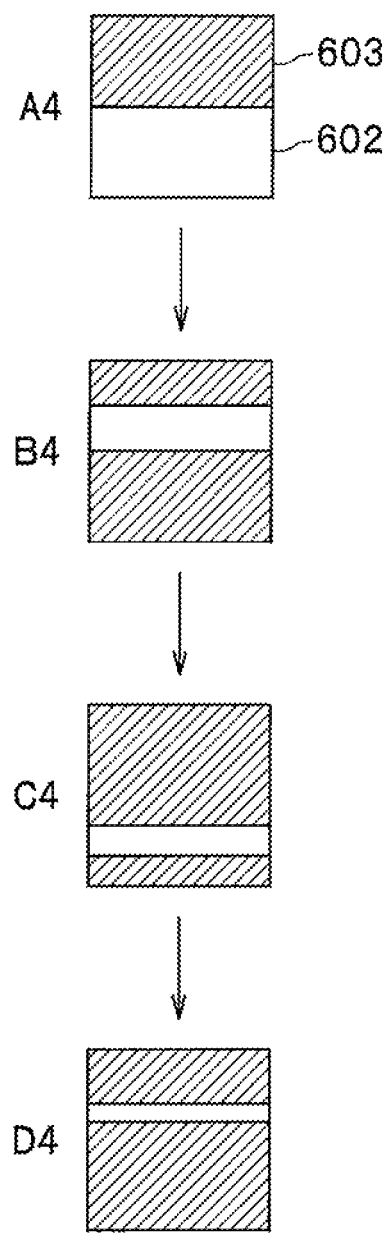
FIG. 19 is a view showing a state of mixing in the flow path of the microreactor according to the sixth embodiment.

Accordingly, as shown in FIG. 19, in the flow path B4, the raw material 603 on the high-flow-rate side flows through the lower plate 109e in an adjacent state from the lower side of the drawing, with respect to the mixture in the flow path A4 on the upper side.

Next, as shown in FIG. 18, in the flow path C4 formed in the upper plate 108e, the raw material on the high-flow-rate side from the branch flow path 102C4 formed in the upper plate 108e merges with the mixture in the flow path B4 formed in the lower plate 109e. Accordingly, as shown in FIG. 19, in the flow path C4, the raw material 603 on the high-flow-rate side flows through the upper plate 108e in an adjacent state from the upper side of the drawing, with respect to the mixture in the flow path B4 on the lower side.

Then, as shown in FIG. 18, in the flow path D4 formed in the lower plate 109e, the raw material on the high-flow-rate side from the branch flow path 102D4 formed in the lower plate 109e, merges with the mixture from the flow path C4 formed in the upper plate 108e. Accordingly, as shown in FIG. 19, in the flow path D4 (the residence flow path 104), the raw material 603 on the high-flow-rate side flows through, with respect to the state of the flow path C4 on the upper side, the lower plate 109e in an adjacent state from the lower side of the drawing.

As described above, the raw material 603 on the high-flow-rate side and the raw material 602 on the low-flow-rate side are mixed actually, but in FIG. 19, the raw material 603 on the high-flow-rate side and the raw material 602 on the low-flow-rate side are described as not being mixed in order to make the merging state easily understood, similarly to the above description. If the raw material 603 on the high-flow-rate side and the raw material 602 on the low-flow-rate side are not mixed, it can be said that the raw materials 603 on the high-flow-rate side merge in a way of sandwiching the raw material 602 on the low-flow-rate side from the upper-lower direction of the drawing.

In order to perform the mixing satisfactorily, it is desirable that the representative diameters of the flow paths A4 to C4, and D4 (the residence flow path 104) in the microreactor 101e are set to be 2 mm or less. In particular, in order to rapidly mix the raw materials by molecular diffusion in the merging points 761 to 764, and the residence flow path 104, the representative diameters of flow paths are desired to be within a range of tens of μm to 1 mm. In addition, in the microreactor 101e, the two types of raw materials may be mixed uniformly, or may be non-uniform (in the so-called emulsified state) without being mixed.

Although the high-flow-rate side flow path 102 is branched into four flow paths in the microreactor 101e according to the sixth embodiment, it may be branched into three, or five or more flow paths in accordance with the flow rate ratio (volume ratio) of the two types of raw materials. In general, as the flow rate ratio (volume ratio) of the two types of raw materials increases, it is desirable to increase the number of branches of the high-flow-rate side flow path 102.

As described above, according to the microreactor 101e according to the sixth embodiment, the flow paths A4 to D4 move in the extension line direction of the branch flow paths 102A4 to 102D4 respectively only by a predetermined distance after merging, and then move towards the discharge port 107. The microreactor 101e makes the flow of the mixture after each merging smoother than that of the microreactor 101d shown in FIG. 12 by adopting such a configuration.

Although each flow path is formed in the upper plate 108 in the first to the fourth embodiments, it may be formed in the lower plate 109d.

In addition, in the fifth embodiment, the high-flow-rate side flow path 102, the branch flow paths 102A3 and 102C3, and the flow paths A3 and C3 are formed in the upper plate 108d, and the low-flow-rate side flow path 103, the branch flow paths 102B3 and 102D3, and the flow paths B3 and D3 (the residence flow path 104) are formed in the lower plate 109d, but the above configurations may be reversed. It also applies to the sixth embodiment.

Further, although the microreactors 101A and 101B include the structure same as the microreactor 101 shown in FIG. 1, the microreactor 101a shown in FIG. 6, the microreactor 101b shown in FIG. 8, the microreactor 101c shown in FIG. 10, the microreactor 101d shown in FIG. 12 and the microreactor 101e shown in FIG. 16 may be used. In addition, a device to which the adjustment microreactor 301 shown in FIG. 4 is connected may be used as the microreactors 101A and 101B shown in FIG. 3.

Although raw materials having two types of flow rates may be used in the present embodiment, three or more types of raw materials may be used. In this case, for example, the raw materials on the high-flow-rate side may sequentially merge in a way of sandwiching the raw material with the lowest flow rate. Further, in this case, the flow path internal volume of the flow path may be increased as the flow rate increases.

The microreactors 101 and 101a to 101e according to the first to the sixth embodiments are used in the manufacture of Antibody Drug Conjugate (ADC)-pharmaceutical product, and used in the on-demand pharmaceutical product manufacturing device.

This invention is not limited to the above-described embodiments and includes various modifications. For example, the above-described embodiments have been described in detail in order to facilitate the understanding of the invention, but the invention is not necessarily limited to have all of the described configurations. A part of the configuration of one embodiment can be replaced with the configuration of another embodiment, and the configuration of another embodiment can also be added to the configuration of a certain embodiment. With respect to a part of a configuration of each embodiment, another configuration can be added, removed, or replaced.

Control lines and information lines are considered to be necessary for the description, but not all the control lines and the information lines are necessarily shown in the products. In practice, almost all the configurations may be considered to be mutually connected.

REFERENCE SIGN LIST 101, 101A, 101B, 101a to 101e: microreactor
102: high-flow-rate side flow path (flow path for high-flow-rate raw material)
102a, 102b, 102A1 to 102A4, 102B1 to 102B4, 102C1 to 102C4, 102D1 to 102D4: branch flow path
103: low-flow-rate side flow path (flow path for low-flow-rate raw material)
104: residence flow path
105: high-flow-rate side introduction port
106: low-flow-rate side introduction port
107: discharge port
108, 108d, 108e: upper plate
109, 109d, 109e: lower plate
111b, 701 to 704, 711 to 714, 741 to 744, 761 to 764: merging point
111a, 700, 700b, 700c, 710, 710b, 710c, 731 to 733, 751 to 753: branch point
200: chemical product manufacturing system
201: high-flow-rate side raw material container
202: first low-flow-rate side raw material container
203: second low-flow-rate side raw material container
204, 204a to 204c: pump
205: product container
206: waste container
207: switching valve
208: check valve
209, 209a, 209b: thermostatic tank
210: weight sensor
211: pressure sensor
212: temperature sensor 213, 213a to 213e: tube
221, 221a to 221e: loop
603: raw material on high-flow-rate side
602: raw material on low-flow-rate side
700a, 700d, 710a, 710d: bend point
801 to 804, 811 to 814: section
A1 to A4, B1 to B4, C1 to C4, D1 to D4: flow path

The invention claimed is:

1. A microreactor, comprising:
a plurality of flow paths for a plurality of raw materials with different flow rates to flow therethrough respectively;
a first introduction port through which a high-flow-rate material is introduced;
a second introduction port through which a low-flow-rate material is introduced;
a first flow path, in communication with the first introduction port, that branches into a plurality of second paths, wherein the plurality of second paths merge downstream; and
a third flow path, in communication with the second introduction port,
wherein each of the plurality of second paths are merged into the third flow path.

2. The microreactor according to claim 1, wherein for internal volumes of flow paths when each of the raw materials finally merge, an internal volume of the flow path for the high-flow-rate raw material is larger than an internal volume of the flow path for the low-flow-rate raw material.

3. The microreactor according to claim 1, wherein each of the plurality of second paths are merged into the third flow path at a single intersection.

4. The microreactor according to claim 3, wherein at the single intersection, respective second paths merge into the third flow path on both sides of the third flow path.

5. The microreactor according to claim 1, wherein each of the plurality of second paths are merged into the third flow path at a single intersection, and wherein at least one orifice is disposed downstream from the single intersection.

6. The microreactor according to claim 1, wherein the plurality of second paths merges stepwise into the third flow path.

7. The microreactor according to claim 6, wherein the plurality of second paths alternately merge into the third flow path from different directions.

8. The microreactor according to claim 7, wherein the microreactor is configured by two plates, the flow paths are formed on each of the plates, and the flow paths are formed such that the plurality of second paths alternately merge with the third flow path from directions of each of the two plates.

9. The microreactor according to claim 1, wherein a fourth flow path is disposed downstream from a final merging point of the plurality of paths.

10. The microreactor according to claim 1, wherein a material of the microreactor is polymethylpentene or polyethylene.

11. The microreactor according to claim 1, wherein a diameter of the flow paths is 2 mm or less.

12. A chemical product manufacturing system, comprising:
at least one microreactor, which includes a plurality of flow paths for a plurality of raw materials with different flow rates to flow therethrough, respectively;
a first introduction port through which a high-flow-rate material is introduced;
a second introduction port through which a low-flow-rate material is introduced;
a first flow path, in communication with the first introduction port, that branches into a plurality of second paths, wherein the plurality of second paths merge downstream; and
a third flow path, in communication with the second introduction port; and
one or more pumps configured to deliver the raw materials to each of the at least one microreactor,
wherein each of the plurality of second paths are merged into the third flow path.

* * * * *